United States Patent
Hsieh et al.

(10) Patent No.: US 12,302,595 B2
(45) Date of Patent: May 13, 2025

(54) DUMMY HYBRID FILM FOR SELF-ALIGNMENT CONTACT FORMATION

(71) Applicant: Taiwan Semiconductor Manufacturing Co., Ltd., Hsinchu (TW)

(72) Inventors: Bor Chiuan Hsieh, Taoyuan (TW); Tsai-Jung Ho, Xihu Township (TW); Po-Cheng Shih, Hsinchu (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 527 days.

(21) Appl. No.: 17/648,037

(22) Filed: Jan. 14, 2022

(65) Prior Publication Data

US 2023/0163194 A1 May 25, 2023

Related U.S. Application Data

(60) Provisional application No. 63/264,396, filed on Nov. 22, 2021.

(51) Int. Cl.
| | | |
|---|---|---|
| H10D 30/01 | (2025.01) | |
| H10D 30/62 | (2025.01) | |
| H10D 64/01 | (2025.01) | |

(52) U.S. Cl.
CPC ....... *H10D 30/0215* (2025.01); *H10D 30/024* (2025.01); *H10D 30/6211* (2025.01);
(Continued)

(58) Field of Classification Search
CPC ............ H01L 29/66515; H01L 29/401; H01L 29/41791; H01L 29/66545;
(Continued)

(56) References Cited

U.S. PATENT DOCUMENTS 9,064,801 B1 * 6/2015 Horak ............... H01L 21/76834
9,824,921 B1    11/2017 Labonte et al.
(Continued)

FOREIGN PATENT DOCUMENTS

KR    20180103402 A    9/2018
KR    20180121314 A    11/2018
(Continued)

*Primary Examiner* — Allison Bernstein
(74) *Attorney, Agent, or Firm* — Slater Matsil, LLP

(57) ABSTRACT

A method includes forming a dummy gate stack over a semiconductor region, forming gate spacers on opposing sides of the dummy gate stack, forming a source/drain region on a side of the dummy gate stack, forming an inter-layer dielectric over the source/drain region, replacing the dummy gate stack with a replacement gate stack, recessing the replacement gate stack to form a recess between the gate spacers, depositing a liner extending into the recess, depositing a masking layer over the liner and extending into the recess, forming an etching mask covering a portion of the masking layer, and etching the inter-layer dielectric to form a source/drain contact opening. The source/drain region is underlying and exposed to the source/drain contact opening. A source/drain contact plug is formed in the source/drain contact opening. A gate contact plug extends between the gate spacers and electrically connecting to the replacement gate stack.

20 Claims, 28 Drawing Sheets

(52) U.S. Cl.
CPC ......... H10D 30/6219 (2025.01); H10D 64/01 (2025.01); H10D 64/017 (2025.01)

(58) Field of Classification Search
CPC ........... H01L 29/66795; H01L 29/7851; H01L 21/28518; H01L 21/76831; H01L 21/76832; H01L 21/76897; H01L 29/165; H01L 29/267; H01L 29/665; H01L 29/7848; H01L 29/785; H01L 21/823475; H01L 21/823431; H01L 21/823437; H01L 27/0886
See application file for complete search history.

(56) References Cited

U.S. PATENT DOCUMENTS

| | | |
|---|---|---|
| 10,043,879 B1 | 8/2018 | Kim et al. |
| 10,062,784 B1 * | 8/2018 | Lee .................. H01L 27/0886 |
| 10,211,302 B2 * | 2/2019 | Cheng ................ H01L 29/456 |
| 10,707,131 B2 * | 7/2020 | Lim .................. H01L 21/82345 |
| 11,201,084 B2 | 12/2021 | Chen et al. |
| 11,430,694 B2 | 8/2022 | Tsai et al. |
| 11,469,139 B2 | 10/2022 | Chen et al. |
| 2013/0075821 A1 | 3/2013 | Baars et al. |
| 2015/0041909 A1 | 2/2015 | Bouche et al. |
| 2018/0076334 A1 | 3/2018 | Ando et al. |
| 2018/0083002 A1 | 3/2018 | Kim et al. |
| 2018/0342420 A1 | 11/2018 | You et al. |
| 2019/0006515 A1 | 1/2019 | Cheng et al. |
| 2019/0131176 A1 | 5/2019 | Liao et al. |
| 2019/0355615 A1 | 11/2019 | Shu et al. |
| 2020/0105577 A1 | 4/2020 | Liang et al. |
| 2021/0313440 A1 | 10/2021 | Peng et al. |

FOREIGN PATENT DOCUMENTS

| | | |
|---|---|---|
| KR | 20210035032 A | 3/2021 |
| TW | 202109674 A | 3/2021 |

* cited by examiner

DUMMY HYBRID FILM FOR SELF-ALIGNMENT CONTACT FORMATION

PRIORITY CLAIM AND CROSS-REFERENCE

This application claims the benefit of the following provisionally filed U.S. Patent application: Application No. 63/264,396, filed on Nov. 22, 2021, and entitled "Dummy hybrid film for Self Alignment Contact Formation," which application is hereby incorporated herein by reference.

BACKGROUND

In the manufacturing of integrated circuits, source/drain contact plugs are used for connecting to the source and drain regions and the gates of transistors. The source/drain contact plugs are typically connected to source/drain silicide regions, whose formation process includes forming contact openings in an inter-layer dielectric, depositing a metal layer extending into the contact openings, and then performing an anneal process to react the metal layer with the silicon/germanium of the source/drain regions. The source/drain contact plugs are then formed in the remaining contact openings.

In the formation of source/drain contact plugs, the gate stacks of the transistors may be protected by a dielectric hard mask. In the subsequent formation of a gate contact plug, the dielectric hard mask is etched to form an opening, and the contact plug is formed in the resulting opening.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
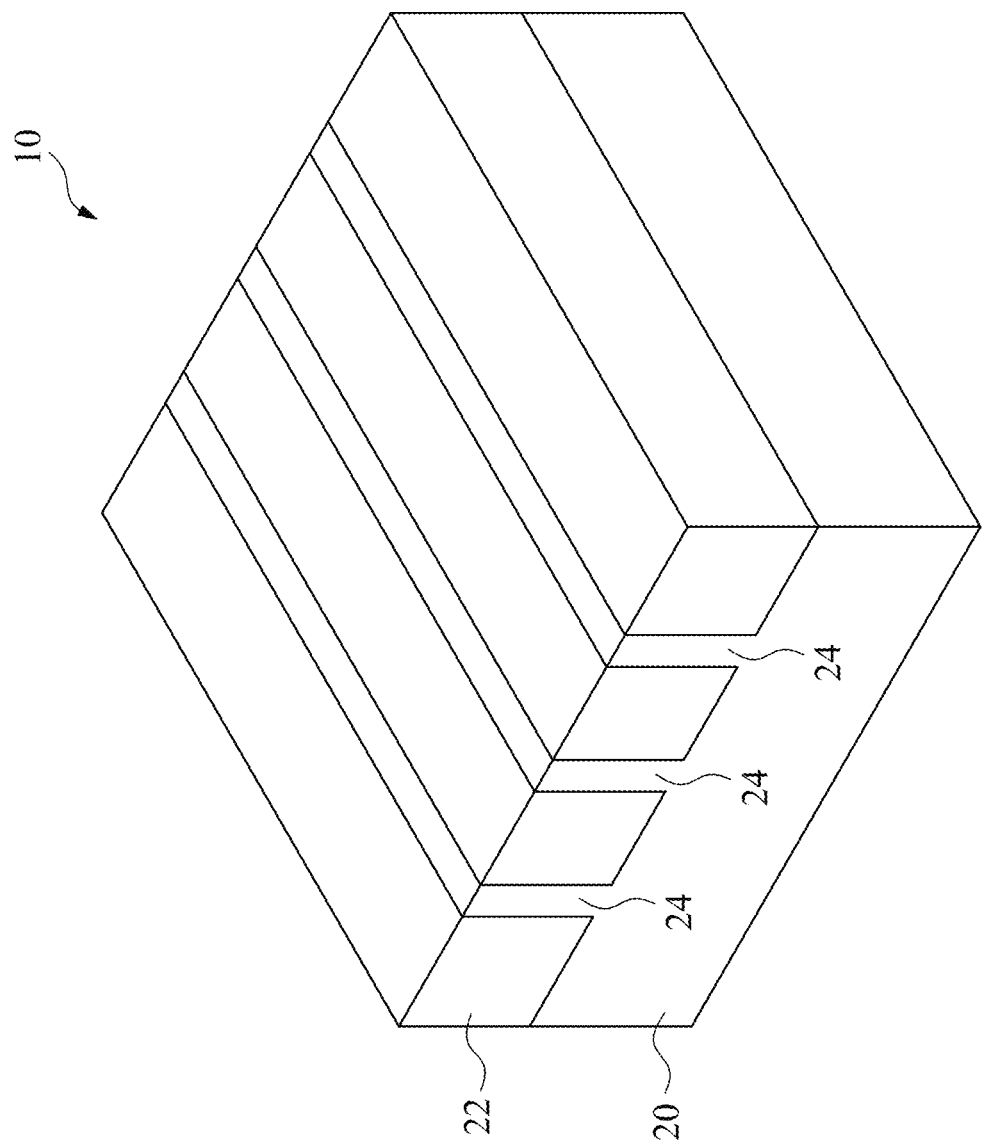
FIGS. 1-5, 6A, 6B, 7-18, 19A, 19B, 20-21, 22A, 22B, and 22C illustrate the cross-sectional views, perspective views, and a top view of intermediate stages in the formation of Fin Field-Effect Transistors (FinFETs) and the corresponding contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs), contact plugs, and the method of forming the same are provided in accordance with some embodiments. In the formation of source/drain contact plugs, hard masks are formed over recessed gate stacks. A hard mask including a bi-layer structure, which includes a dielectric liner and a masking layer/region (which may be a silicon region) over the dielectric liner, is formed. The masking layer has high etching selectivity relative to Inter-Layer Dielectric (ILD), so that the masking layer may better protect the underlying gate stack and reduce leakage current. Although FinFETs are used as examples to explain the concept of the present disclosure, the embodiments may be applied to other types of transistors such as planar transistors, Gate-All-Around (GAA) transistors, or the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-5, 6A, 6B, 7-18, 19A, 19B, 20-21, 22A, 22B, and 22C illustrate the cross-sectional views, perspective views, and a top view of intermediate stages in the formation of FinFETs and contact plugs in accordance with some embodiments of the present disclosure. The corresponding processes are also reflected schematically in the process flow shown in FIG. 24.

Figure 24:
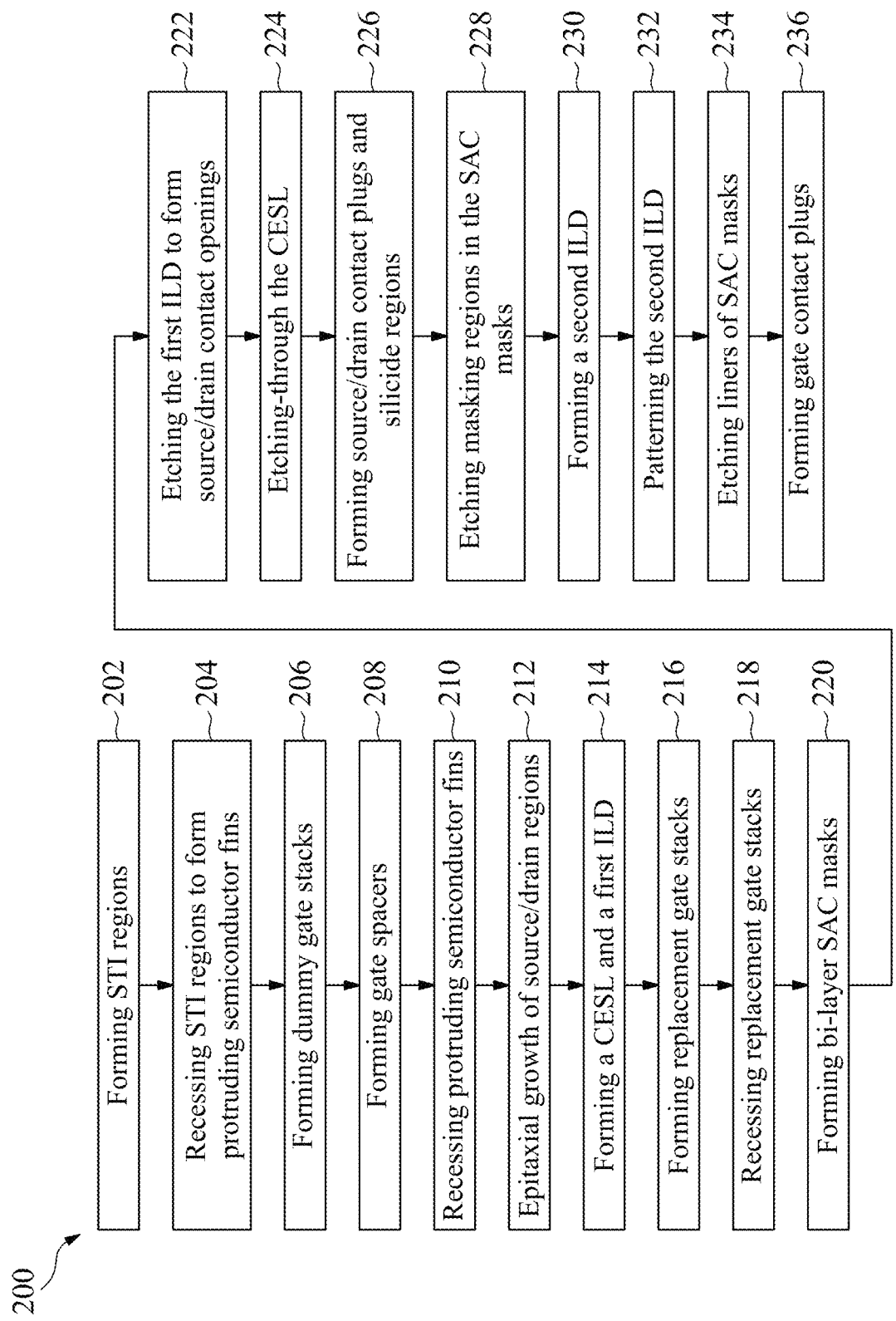
FIG. 24 illustrates a process flow for forming a FinFET and contact plugs in accordance with some embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 24.

The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, a III-V compound semiconductor material, or the like.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
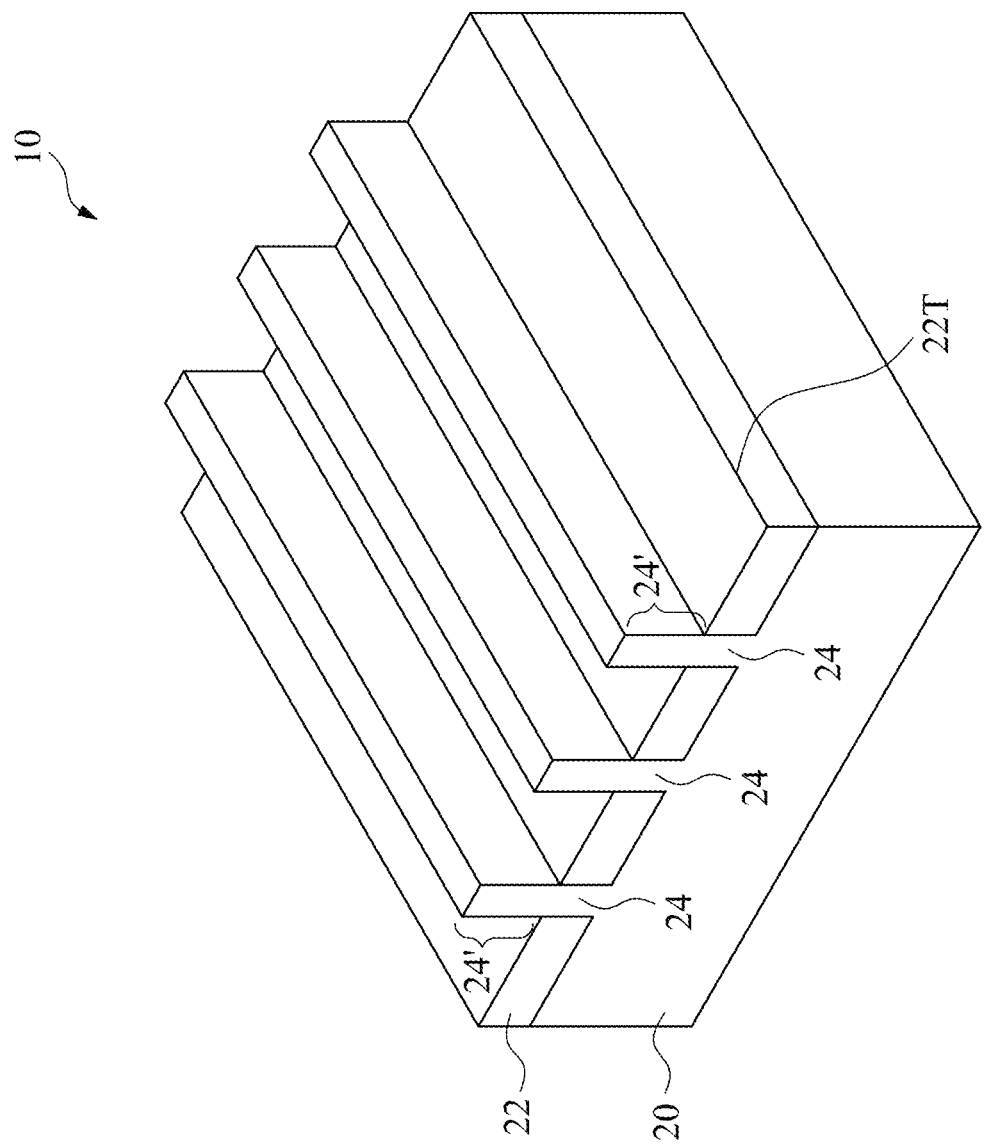

Referring to FIG. 2, STI regions 22 are recessed, so that the top portions of semiconductor strips 24 protrude higher than the top surfaces 22T of the remaining portions of STI regions 22 to form protruding fins 24'. The respective process is illustrated as process 204 in the process flow 200 as shown in FIG. 24. The etching may be performed using a dry etching process, wherein HF and $NH_3$ may be used as the etching gases. During the etching process, plasma may be generated. Argon may also be included. In accordance with alternative embodiments of the present disclosure, the recessing of STI regions 22 is performed using a wet etching process. The etching chemical may include HF, for example.

Figure 3:
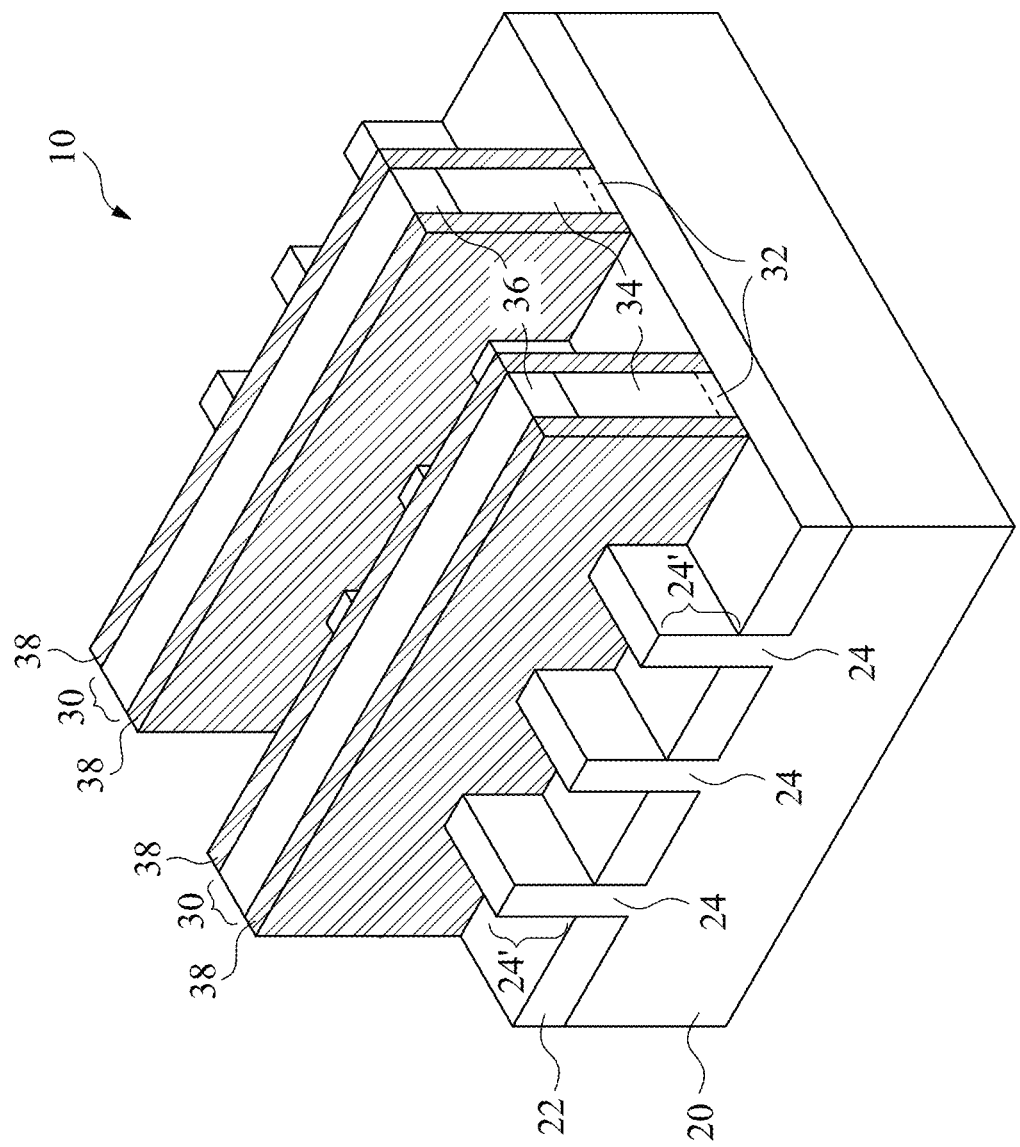

Referring to FIG. 3, dummy gate stacks 30 are formed on the top surfaces and the sidewalls of (protruding) fins 24'. The respective process is illustrated as process 206 in the process flow 200 as shown in FIG. 24. Dummy gate stacks 30 may include dummy gate dielectrics 32 and dummy gate electrodes 34 over dummy gate dielectrics 32. Dummy gate dielectrics 32 may be formed through thermal oxidation, deposition, or the like, and may be formed of or comprise silicon oxide, for example. When dummy gate dielectrics 32 are formed through oxidation, they may not be visible in the illustrated cross-section. Accordingly, dummy gate dielectrics 32 are shown as being dashed to indicate that they may, or may not, be visible.

Dummy gate electrodes 34 may be formed, for example, using polysilicon or amorphous silicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbonitride, or multi-layers thereof. Dummy gate stacks 30 may cross over a plurality of protruding fins 24' and STI regions 22. Dummy gate stacks 30 also have lengthwise directions perpendicular to the lengthwise directions of protruding fins 24'. In accordance with some embodiments, the sidewalls of dummy gate stacks 30 are made as vertical as possible.

Next, gate spacers 38 are formed on the sidewalls of dummy gate stacks 30. The respective process is illustrated as process 208 in the process flow 200 as shown in FIG. 24. In accordance with some embodiments of the present disclosure, gate spacers 38 are formed of a dielectric material such as silicon nitride, silicon carbo-nitride, or the like, and may have a single-layer structure or a multi-layer structure including a plurality of dielectric layers. While not shown, fin spacers may also be formed on the sidewalls of protruding fins 24' when gate spacers 38 are formed.

Figure 4:
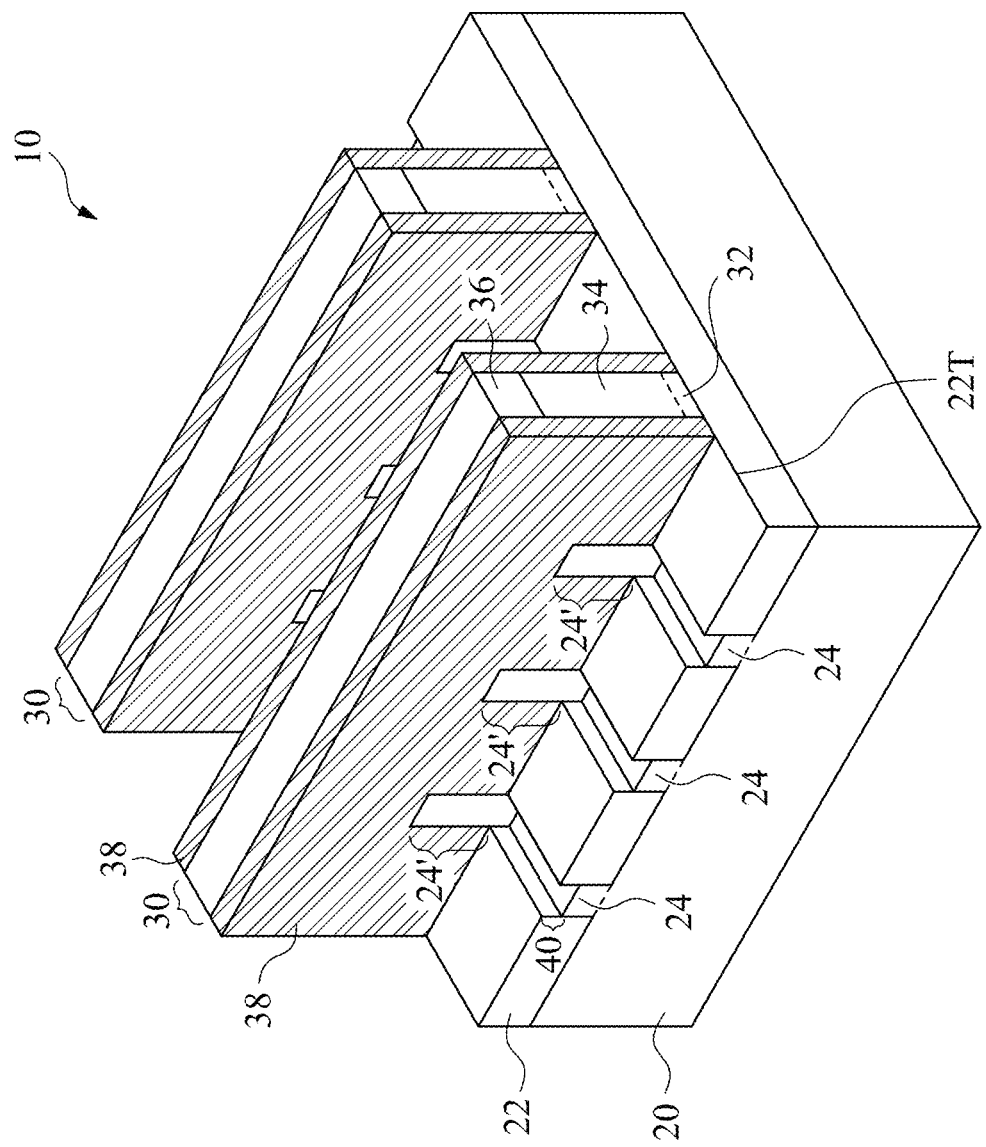

An etching process is then performed to etch the portions of protruding fins 24' that are not covered by dummy gate stacks 30 and gate spacers 38, resulting in the structure shown in FIG. 4. The respective process is illustrated as process 210 in the process flow 200 as shown in FIG. 24. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22T of STI regions 22 in accordance with some embodiments. Recesses 40 are accordingly formed between STI regions 22. Recesses 40 are located on the opposite sides of dummy gate stacks 30.

Figure 5:
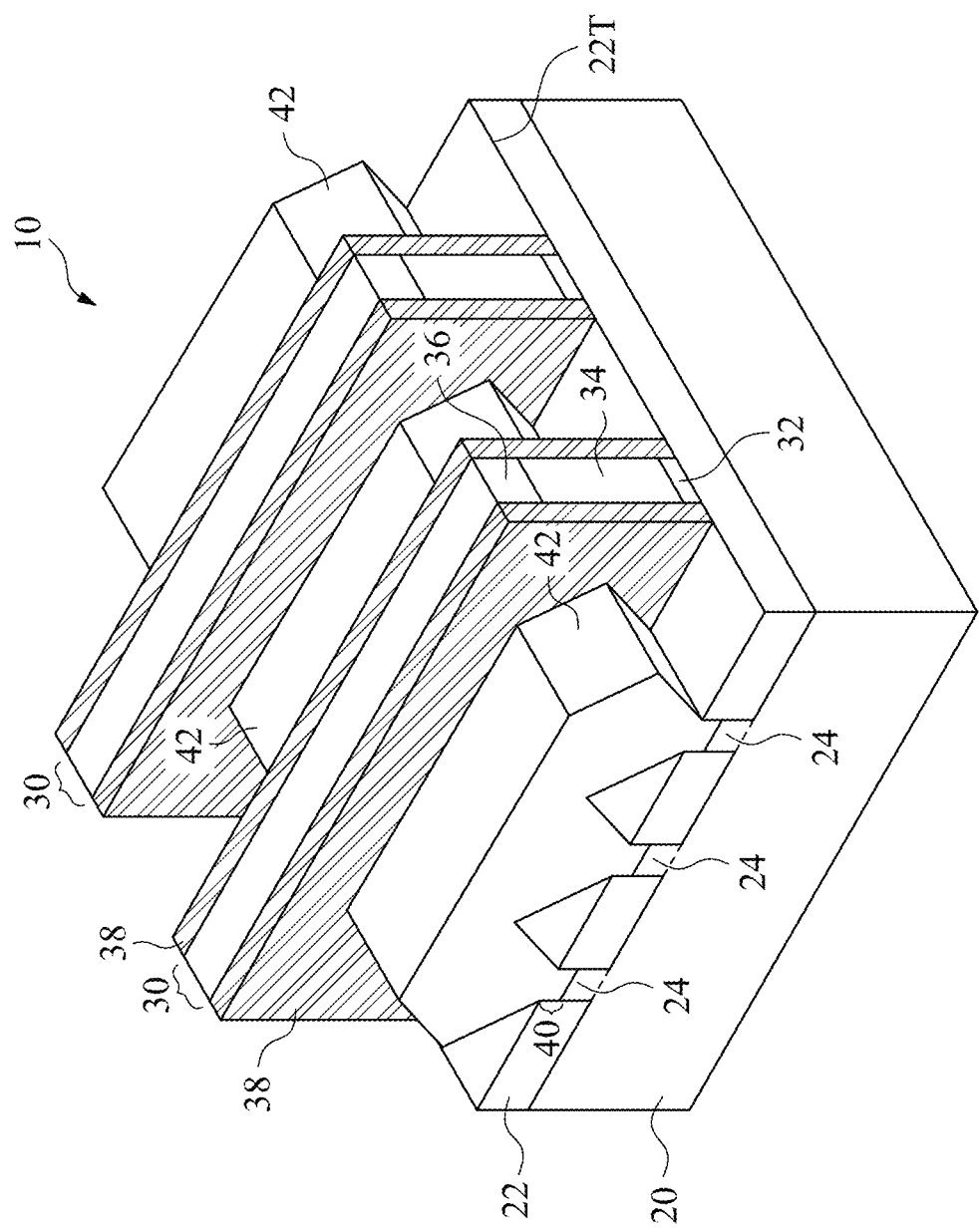

Next, epitaxy regions (source/drain regions) 42 are formed by selectively growing a semiconductor material from recesses 40, resulting in the structure in FIG. 5. The respective process is illustrated as process 212 in the process flow 200 as shown in FIG. 24. In accordance with some embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof.

After epitaxy regions 42 fully fill recesses 40, epitaxy regions 42 start expanding horizontally, and facets may be formed. The neighboring epitaxy regions 42 may be merged or remain separated from each other when the epitaxy process is finished, depending on the spacing between neighboring epitaxy regions 42, and depending on the specification of the resulting FinFETs.

Figure 6A:
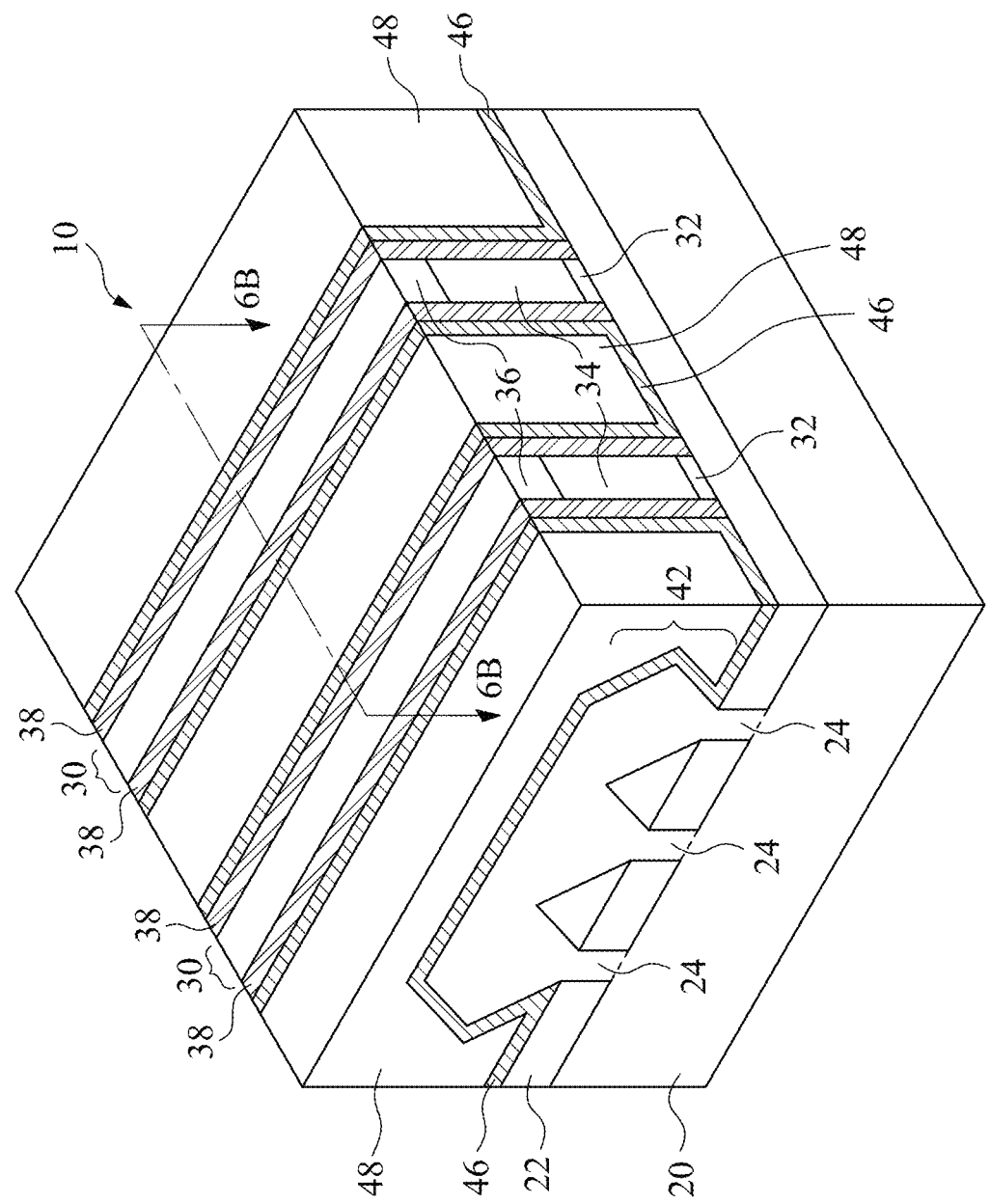

FIG. 6A illustrates the formation of Contact Etch Stop Layer (CESL) 46 and Inter-Layer Dielectric (ILD) 48. The respective process is illustrated as process 214 in the process flow 200 as shown in FIG. 24. CESL 46 may be formed through a conformal deposition process such as an ALD process or a CVD process, for example. CESL 46 may be formed of or comprise silicon oxide, silicon nitride, silicon oxynitride, or the like. ILD 48 may include a dielectric material formed using, for example, FCVD, spin-on coating, CVD, or another deposition process. ILD 48 may also be formed of an oxygen-containing dielectric material, which may be silicon-oxide based, and may include silicon oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48. In accordance with some embodiments, hard masks 36 are used as CMP stop layers for the planarization process.

Figure 6B:
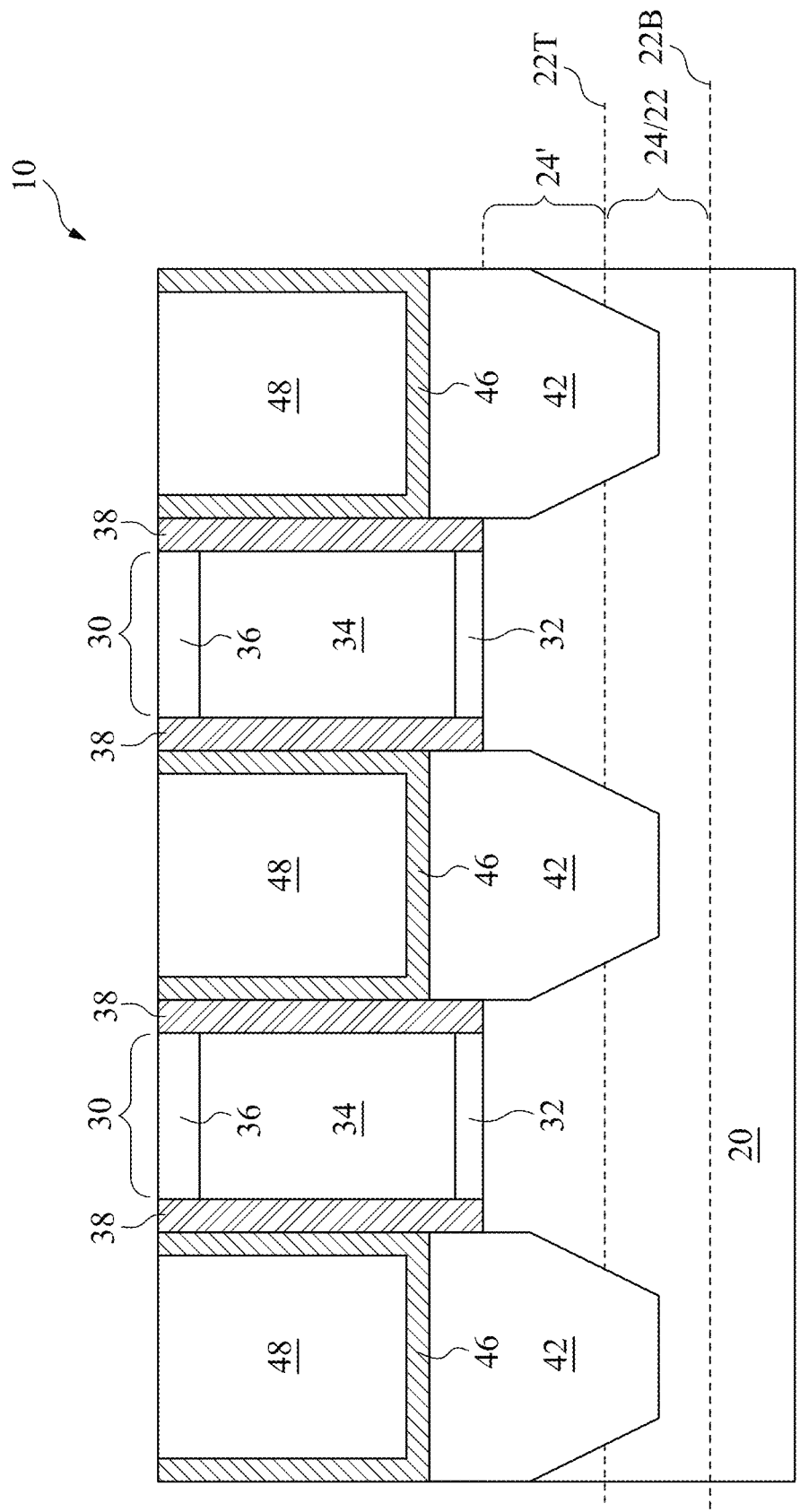

FIG. 6B illustrates a cross-sectional view of dummy gate stacks 30, gate spacers 38, source/drain regions 42, and protruding fins 24' in accordance with some embodiments. The cross-sectional view is obtained from a vertical cross-section 6B-6B in FIG. 6A. The corresponding protruding fins 24' are directly underlying dummy gate stacks 30 and gate spacers 38, while source/drain regions 42 are between dummy gate stacks.

Figure 7:
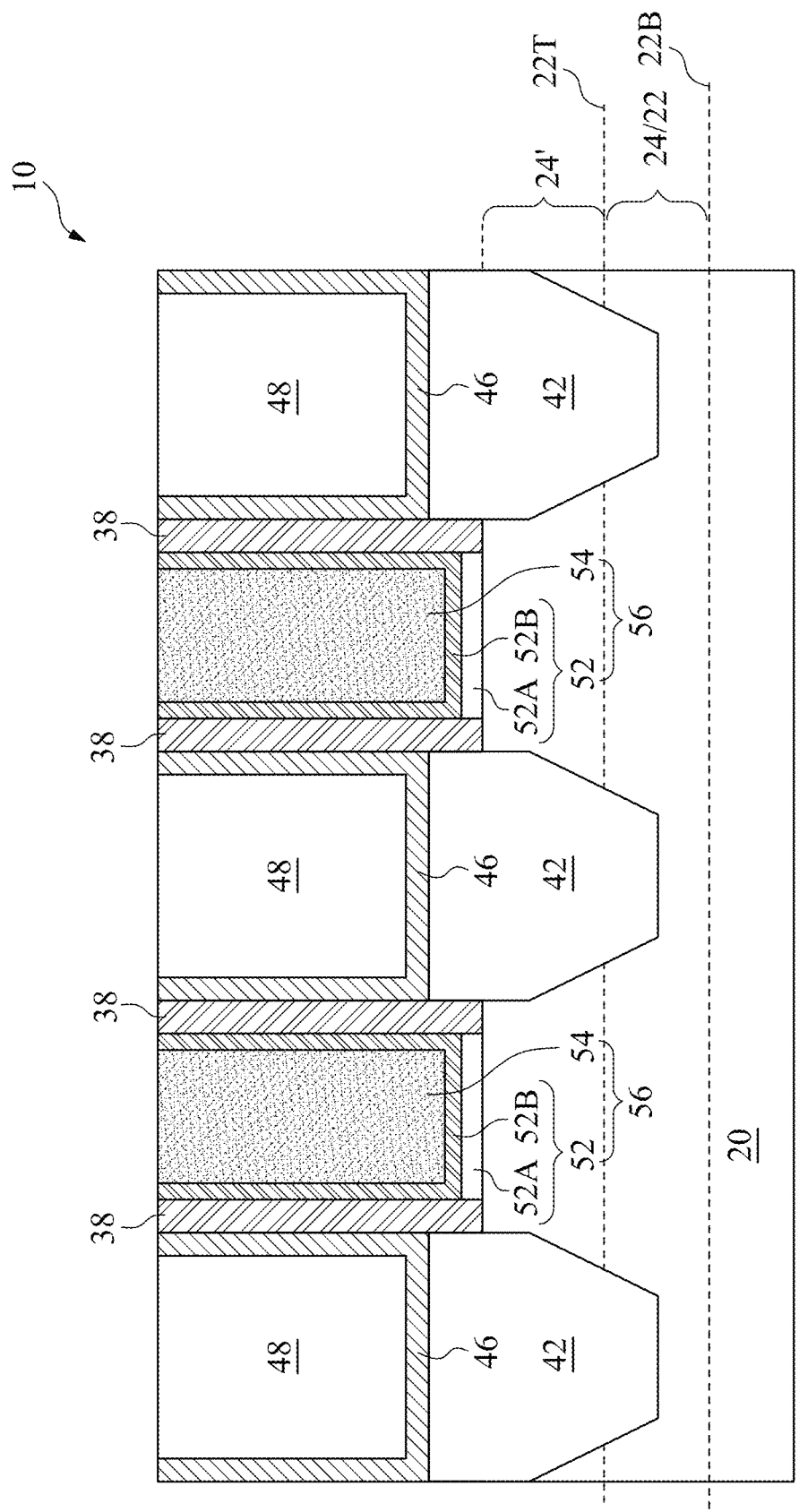

Next, dummy gate stacks 30 (including hard mask layers 36, dummy gate electrodes 34, and dummy gate dielectrics 32) are replaced with replacement gate stacks 56, which include gate electrodes 54 and gate dielectrics 52 as shown in FIG. 7. The respective process is illustrated as process 216 in the process flow 200 as shown in FIG. 24. When forming replacement gate stacks 56, the dummy gate stacks 30 as shown in FIGS. 6A and 6B are removed first in a plurality of etching processes, resulting in trenches/openings to be formed between neighboring portions of gate spacers 38. The top surfaces and the sidewalls of protruding semiconductor fins 24' are exposed to the resulting trenches. In accordance with some embodiments, in the recessing, gate spacers 38 are also recessed. In accordance with alternative embodiments, gate spacers 38 are not recessed.

In accordance with some embodiments of the present disclosure, each of gate dielectric layers 52 include an Interfacial Layer (IL) 52A as its lower part, which contacts the exposed surfaces of the corresponding protruding fins 24'. IL 52A may include an oxide layer such as a silicon oxide layer, which is formed through the thermal oxidation of protruding fins 24', a chemical oxidation process, or a deposition process. Gate dielectric layer 52 may also include a high-k dielectric layer 52B over the IL. High-k dielectric layer 52B may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. High-k dielectric layer 52B is formed as a conformal layer, and extends on the sidewalls of protruding fins 24' and the sidewalls of gate spacers 38. In accordance with some embodiments of the present disclosure, high-k dielectric layer 52B is formed using ALD or CVD.

Gate electrodes 54 are formed over gate dielectrics 52. Gate electrodes 54 include stacked conductive sub-layers. The sub-layers are not shown separately, while the sub-layers are distinguishable from each other. The sub-layers may be deposited using conformal deposition processes such as ALD or CVD.

The stacked conductive layers may include a diffusion barrier layer and one (or more) work-function layer(s) over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to the conductivity type of the respective FinFET. For example, when the FinFET is a p-type FinFET, the work-function layer may include a TaN layer, a TiN layer over the TaN layer, and a TiAl layer over the TiN layer. When the FinFET is an n-type FinFET, the work-function layer may include an aluminum-containing material such as TiAl, TiAlC, TiAlN, or the like. After the deposition of the work-function layer(s), a barrier/capping layer, which may be another TiN layer, is formed.

The deposited gate dielectric layers and conductive layers for forming replacement gate stacks are formed as conformal layers extending into the trenches, and include some portions over ILD 48. Next, a metallic material is deposited to fill the remaining trenches between gate spacers 38. The metallic material may be formed of or comprises tungsten or cobalt, for example. Subsequently, a planarization process such as a CMP process or a mechanical grinding process is performed, so that the excess portions of the gate dielectric layers, conductive sub-layers, and the metallic material over ILD 48 are removed. As a result, metal gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

Figure 8:
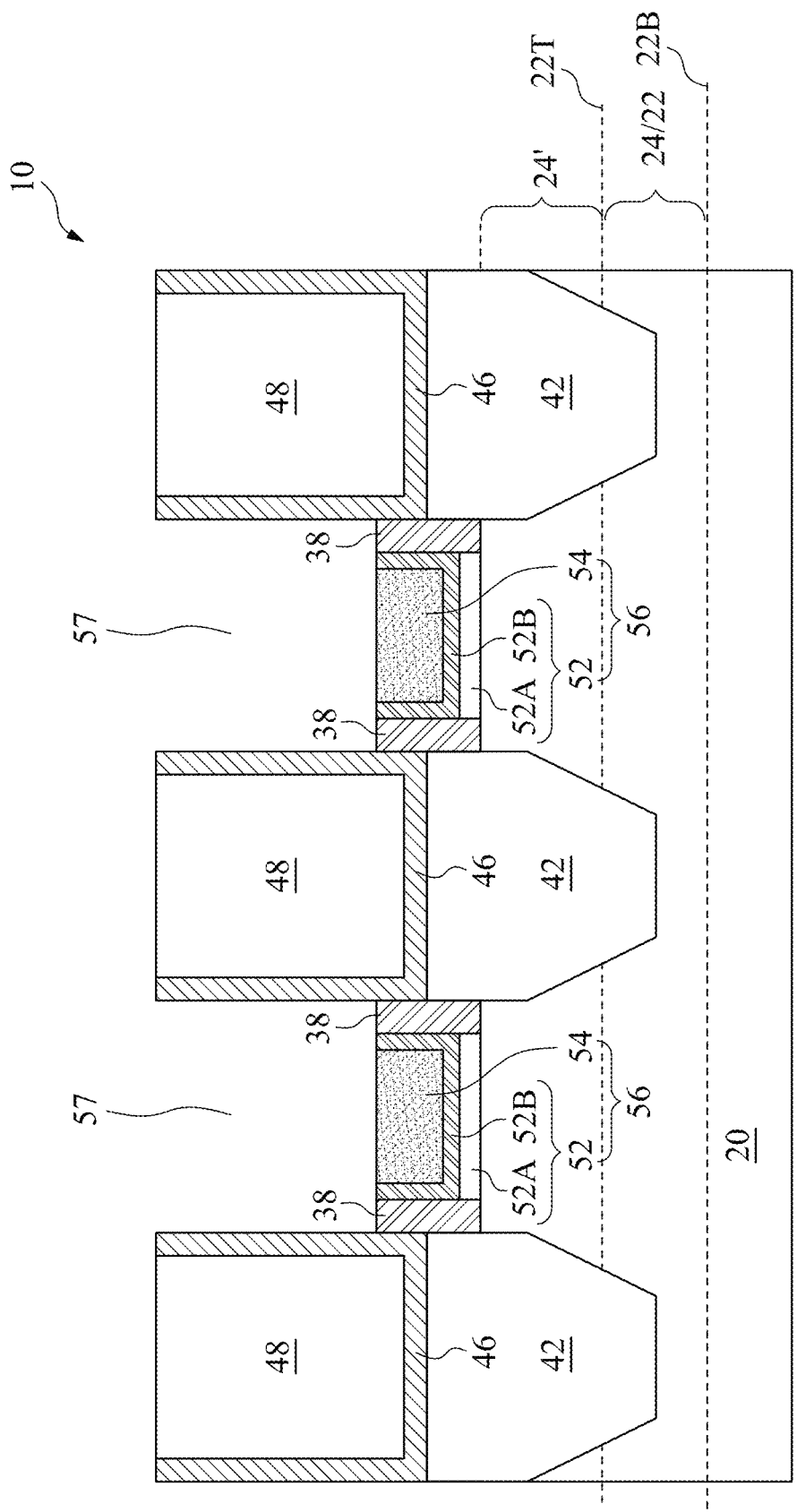
Figure 9:
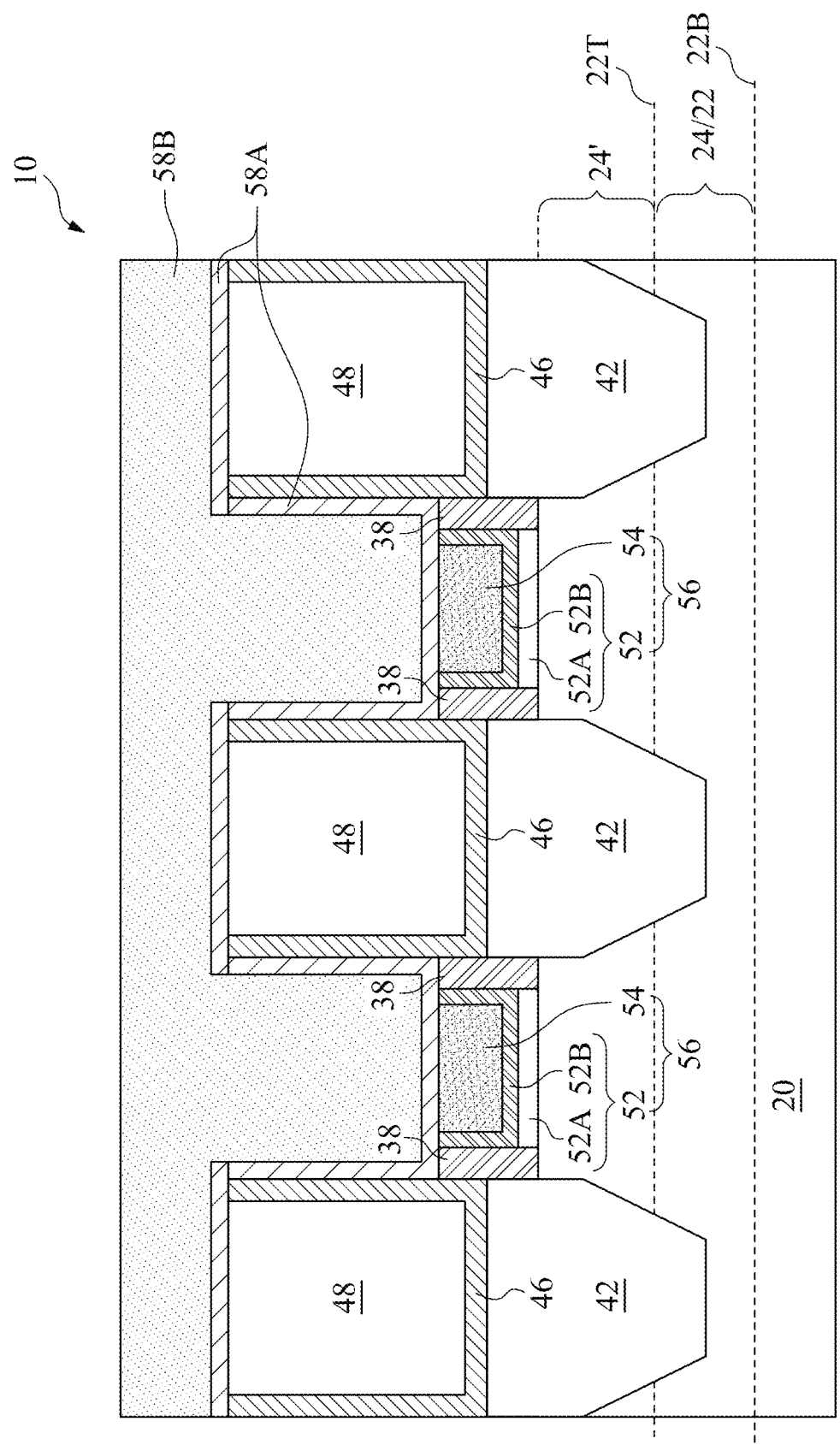
Figure 10:
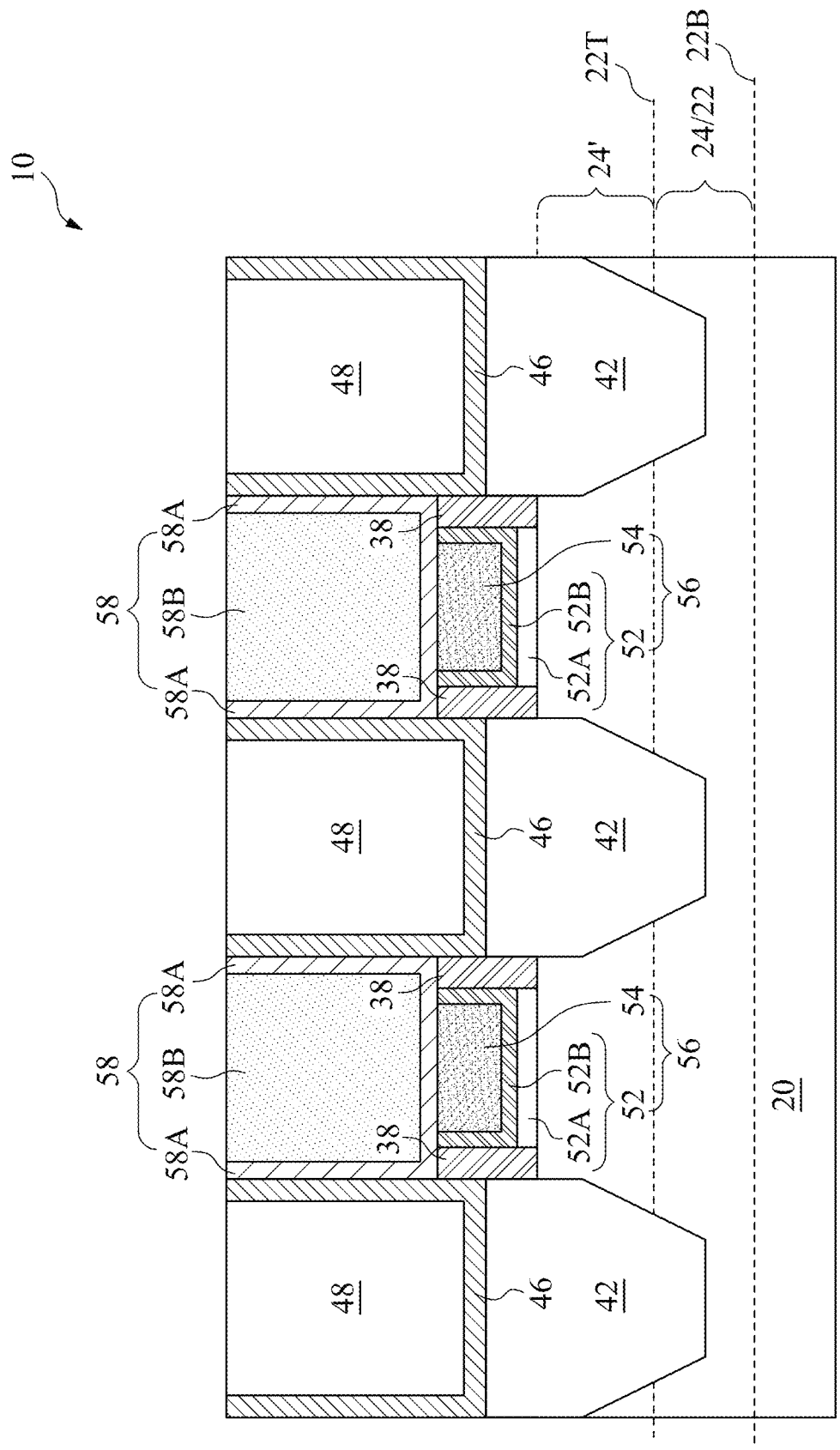

FIGS. 8 through 10 illustrates the formation of bi-layer Self-Aligned Contact (SAC) masks, which are hard masks in accordance with some embodiments. Referring to FIG. 8, an etching process is performed to recess gate stacks 56. The respective process is illustrated as process 218 in the process flow 200 as shown in FIG. 24. Gate spacers 38 may (or may not) be recessed. Recesses 57 are thus formed between opposing vertical portions of CESL 46.

Next, referring to FIG. 9, liner 58A and masking material 58B are deposited, filling recesses 57. In accordance with some embodiments, liner 58A is a dielectric layer, which may be formed of or comprises a material that is different from the material of ILD 48. For example, when ILD 48 is formed of an oxide-based material, liner 58A may be formed of or comprises a nitride such as silicon nitride, silicon oxynitride, silicon carbonitride, etc. Furthermore, the thickness of liner 58A is small, for example, smaller than about 30 Å, and may be in the range between about 6 Å and about 30 Å, and may be smaller than about 6 Å. The material of masking material 58B is further different from the materials of liner 58A and ILD 48, so that in subsequent etching processes (FIGS. 13 and 17), the etching selectivity between masking material 58B and ILD 48 is high, and the etching selectivity between masking material 58B and liner 58A is also high, for example, higher than about 1.5.

In accordance with some embodiments, masking material 58B is silicon, which may include pure or substantially pure silicon, for example, including more than 80 percent, 90 percent, 95 percent, or 99 percent silicon. There may be some hydrogen in masking material 58B, with the hydrogen atomic percentage being between about 0.5 percent and about 20 percent. Masking material 58B may also be another semiconductor material such as silicon germanium. In accordance with other embodiments, masking material 58B is formed of another material with high etching selectivity relative to liner 58A and ILD 48. For example, masking material 58B may be formed of or comprises aluminum oxide, boron nitride, aluminum nitride, titanium oxide, or the like, compounds thereof, or alloys thereof.

A planarization process such as a CMP process or a mechanical grinding process is then performed. The excess portions of liner 58A and masking material 58B over ILD 48 are removed. The remaining portions of liner 58A and masking material 58B are collectively referred to as SAC masks 58, as shown in FIG. 10. The respective process is illustrated as process 220 in the process flow 200 as shown in FIG. 24. The remaining portions of masking material 58B are also referred to as masking regions/layers 58B hereinafter.

Figure 11:
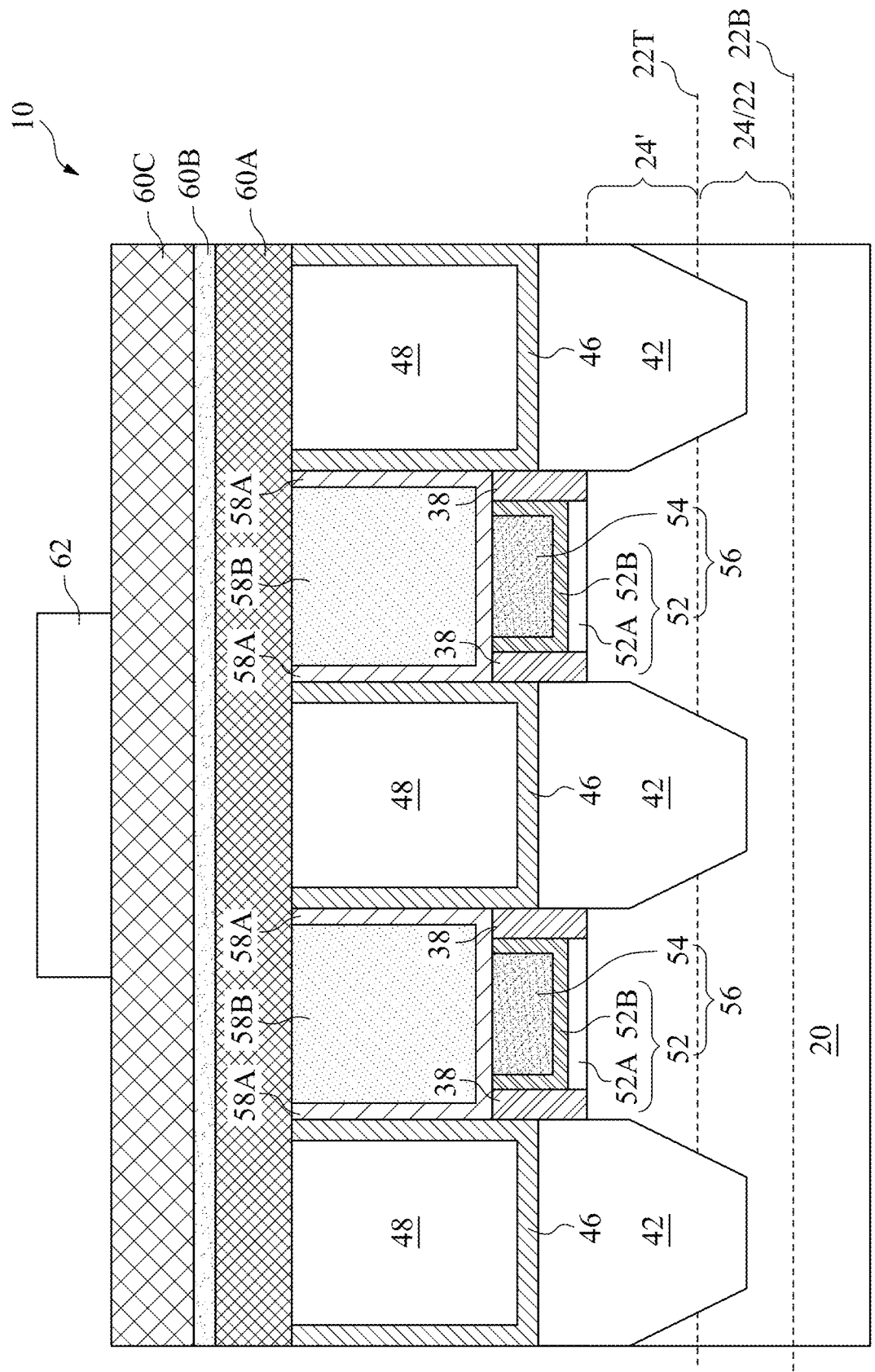

FIG. 11 illustrates the cross-sectional view of the structure after the formation of a plurality of mask layers. It is appreciated that the mask layers may have different number of layers and different materials than illustrated and discussed below, which are all in the scope of the present disclosure. In accordance with some example embodiments, the plurality of mask layers include mask layers 60A, 60B, and 60C.

In accordance with some embodiments, mask layer 60A may be formed of a material selected from silicon oxide, silicon oxy-carbide (SiOC), silicon oxynitride (SiON), or the like, or combinations thereof. Mask layer 60B may be formed of tungsten doped carbide (WDC), for example. Mask layer 60C may be formed of silicon oxide, SiOC, SiON, or the like, or combinations thereof. A patterned etching mask 62 such as a patterned photoresist 62 is formed over the plurality of mask layers. Etching mask 62 may also be a dual-layer, a tri-layer mask, or the like.

Figure 12:
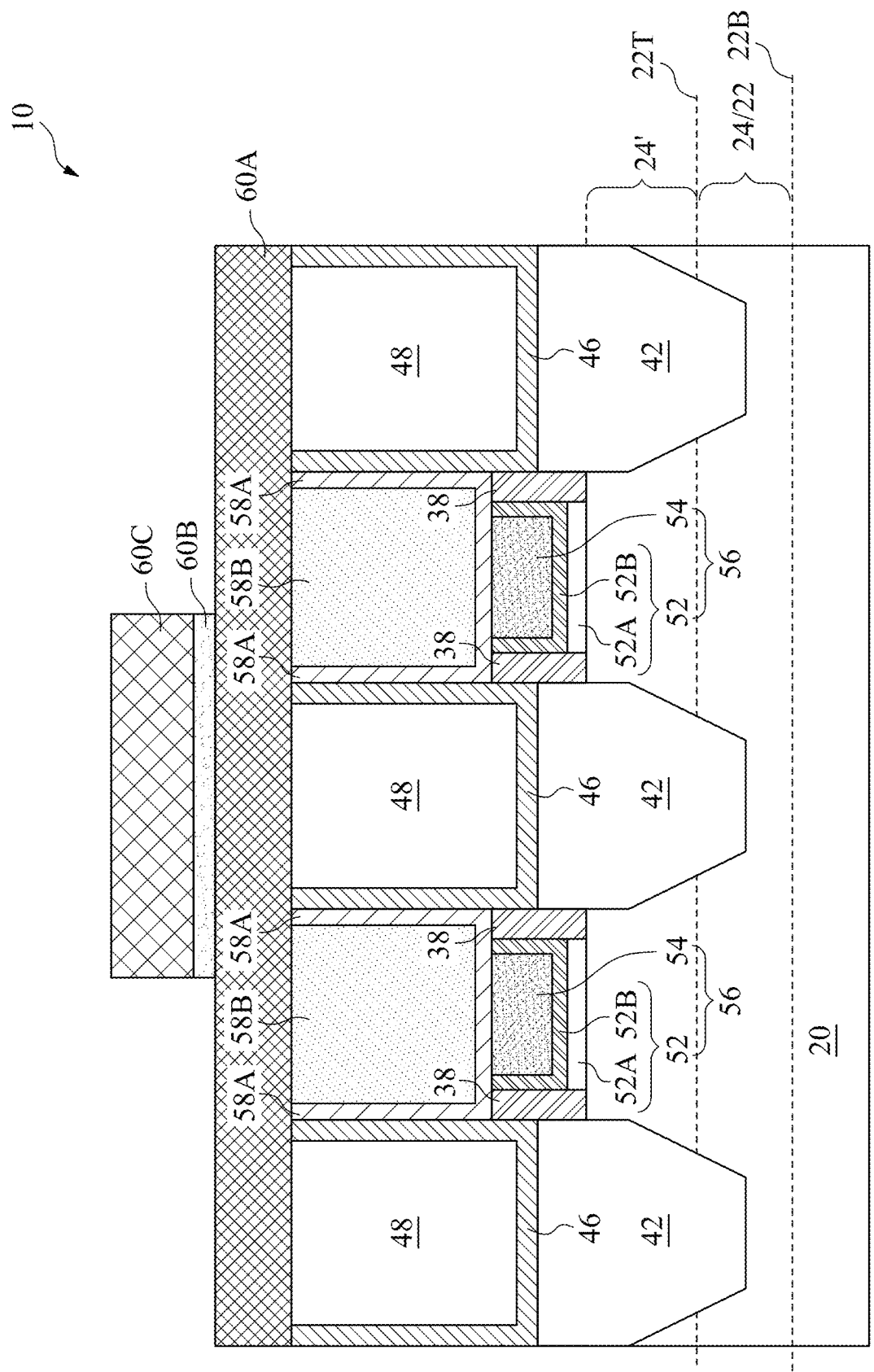
Figure 13:
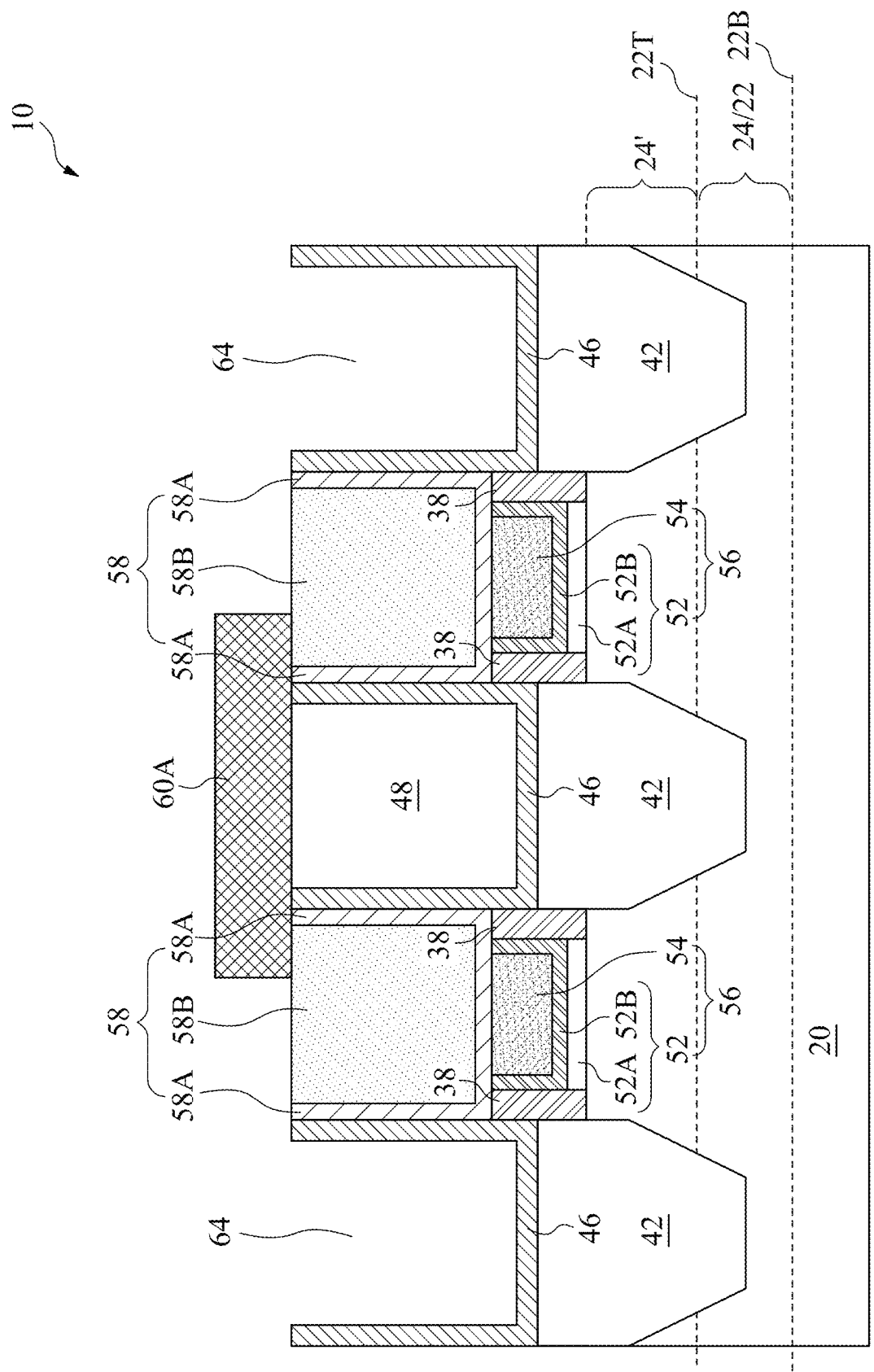
Figure 14:
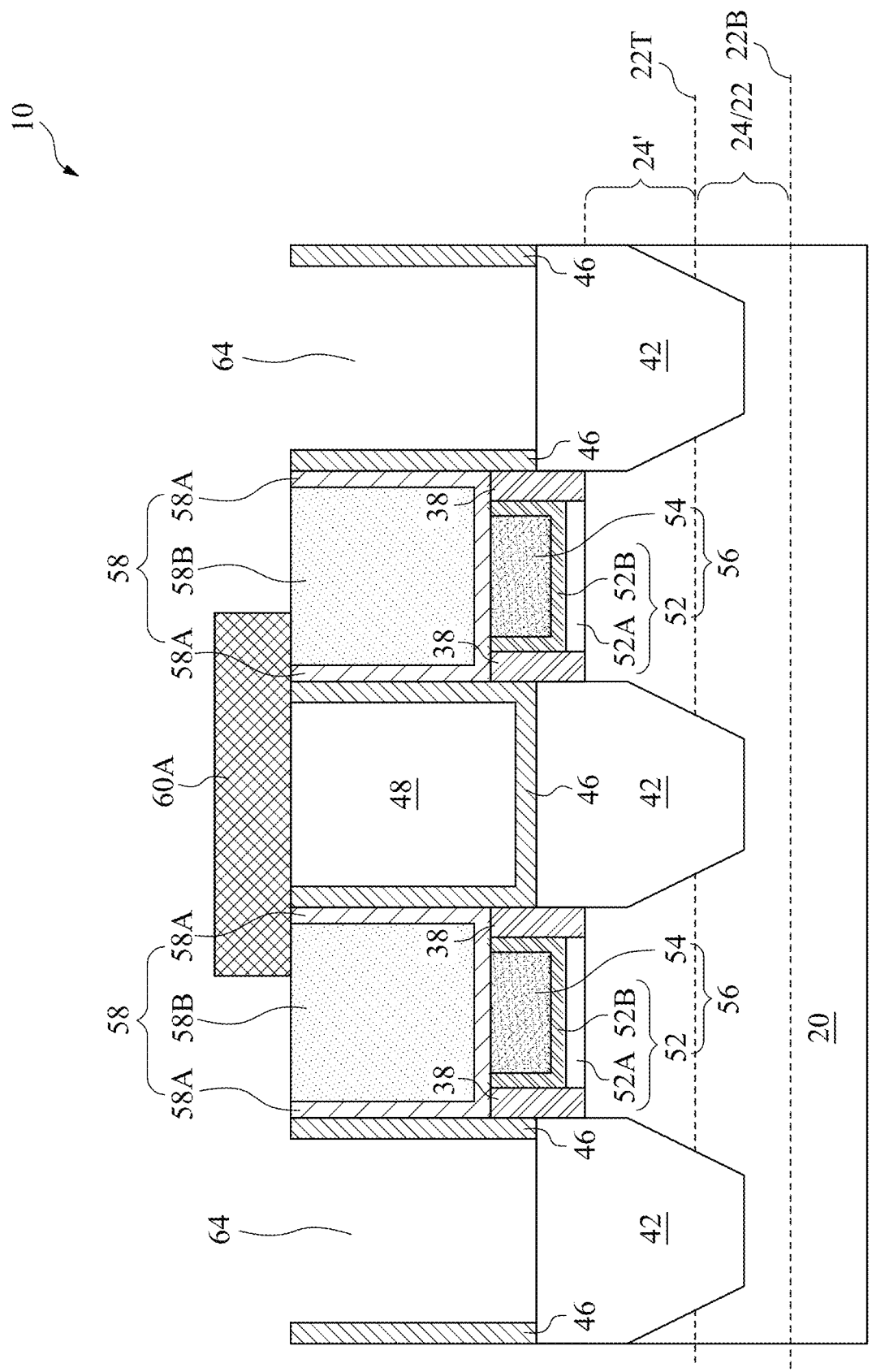

Next, etching mask 62 is used to etch the underlying plurality of mask layers. For example, FIG. 12 illustrates the etching of mask layers 60C and 60B. In a subsequent process, mask layer 60A is also etched, and the remaining mask layers 60C and 60B may be consumed and/or removed (for example, in wet etching processes) if not consumed. The resulting structure is shown in FIG. 13. The resulting mask layer 60A covers some parts of ILD 48, and may further extend directly over some parts of masking regions 58B.

FIG. 13 also illustrates the removal of ILD 48 through an etching process, hence forming source/drain contact openings 64. The respective process is illustrated as process 222 in the process flow 200 as shown in FIG. 24. In accordance with some embodiments, the etching is performed through a dry etching process, a wet etching process, or a dry etching process followed by a wet etching process. The etching may also be anisotropic or isotropic, or may include an anisotropic etching process followed by an isotropic process. For example, when ILD 48 is formed of a silicon-oxide-based material, a dry etching process may be performed using the mixture of $NF_3$ and $NH_3$ or the mixture of HF and $NH_3$ as etching gases. A wet etching process may be performed using HF solution as the etching chemical.

During the removal of the exposed ILD 48, mask layer 60A and masking regions 58 in combination act as the etching mask, which are substantially not recessed in the etching. The etching selectivity ER48/ER58B is high, wherein ER58B is the etching rate of masking regions 58B, and ER48 is the etching rate of ILD 48. For example, etching selectivity ER48/ER58B may be higher than about 1.5, and may be in the range between about 1.5 and about 15. In the meantime, liner 58A is formed of a material different from the material of ILD 48, and hence there is also a significantly high etching selectivity ER48/ER58A, for example, higher than about 10, wherein ER58A is the etching rate of liner 58A. Etching selectivity ER48/ER58A may be lower than the etching selectivity ER48/ER58B. This, however, will not cause significant recessing of liner 58A since liner 58A has its top sides, which are narrow, exposed to the etching chemical.

After the etching, the portions of CESL 46 underlying source/drain contact openings 64 are exposed. Next, referring to FIG. 14, an anisotropic etching process is performed to remove the horizontal portions of CESL 46, revealing the underlying portions of source/drain regions 42. The vertical portions of CESL 46 may be left unremoved. The respective process is illustrated as process 224 in the process flow 200 as shown in FIG. 24.

Figure 15:
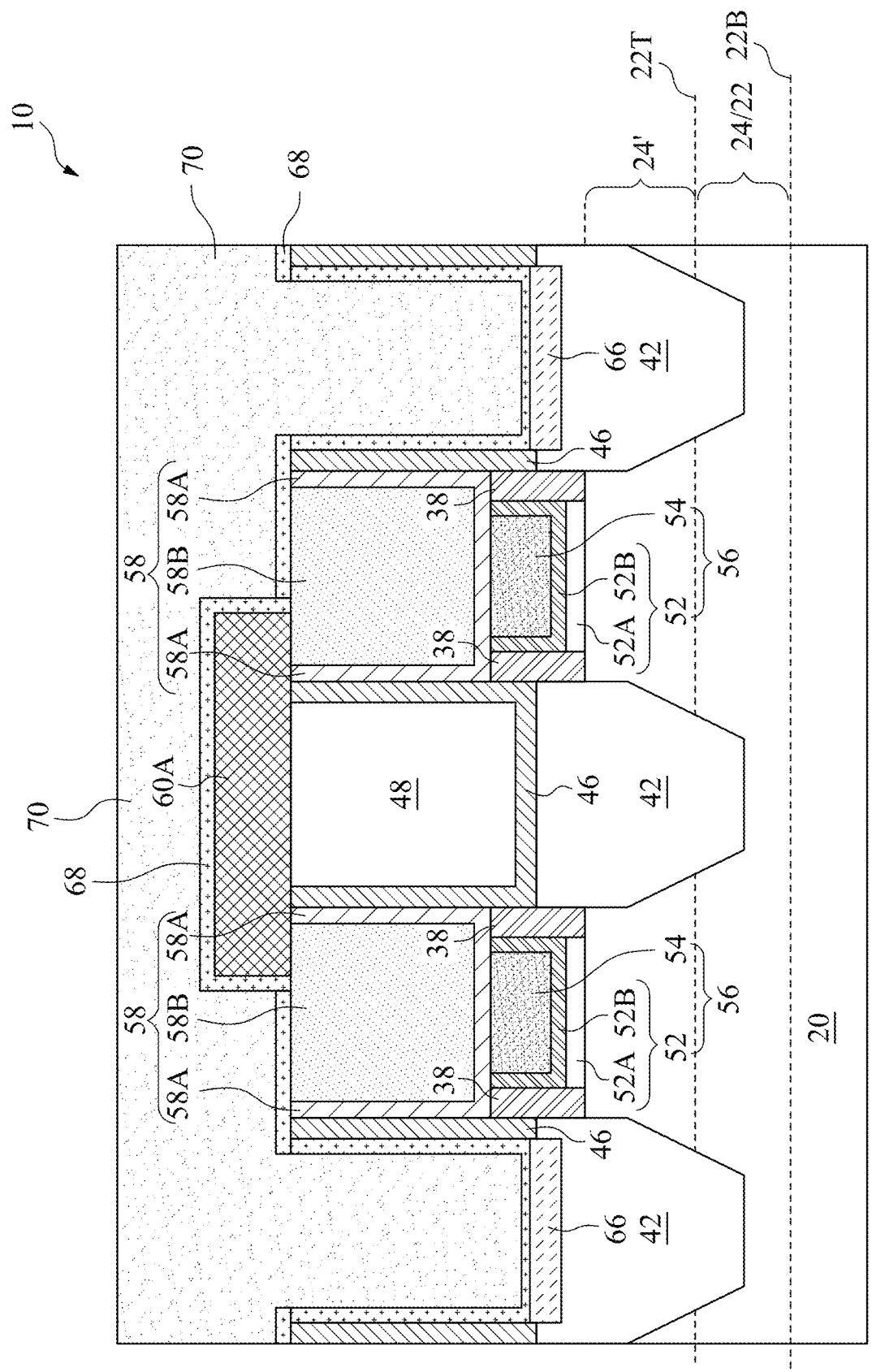
Figure 16:
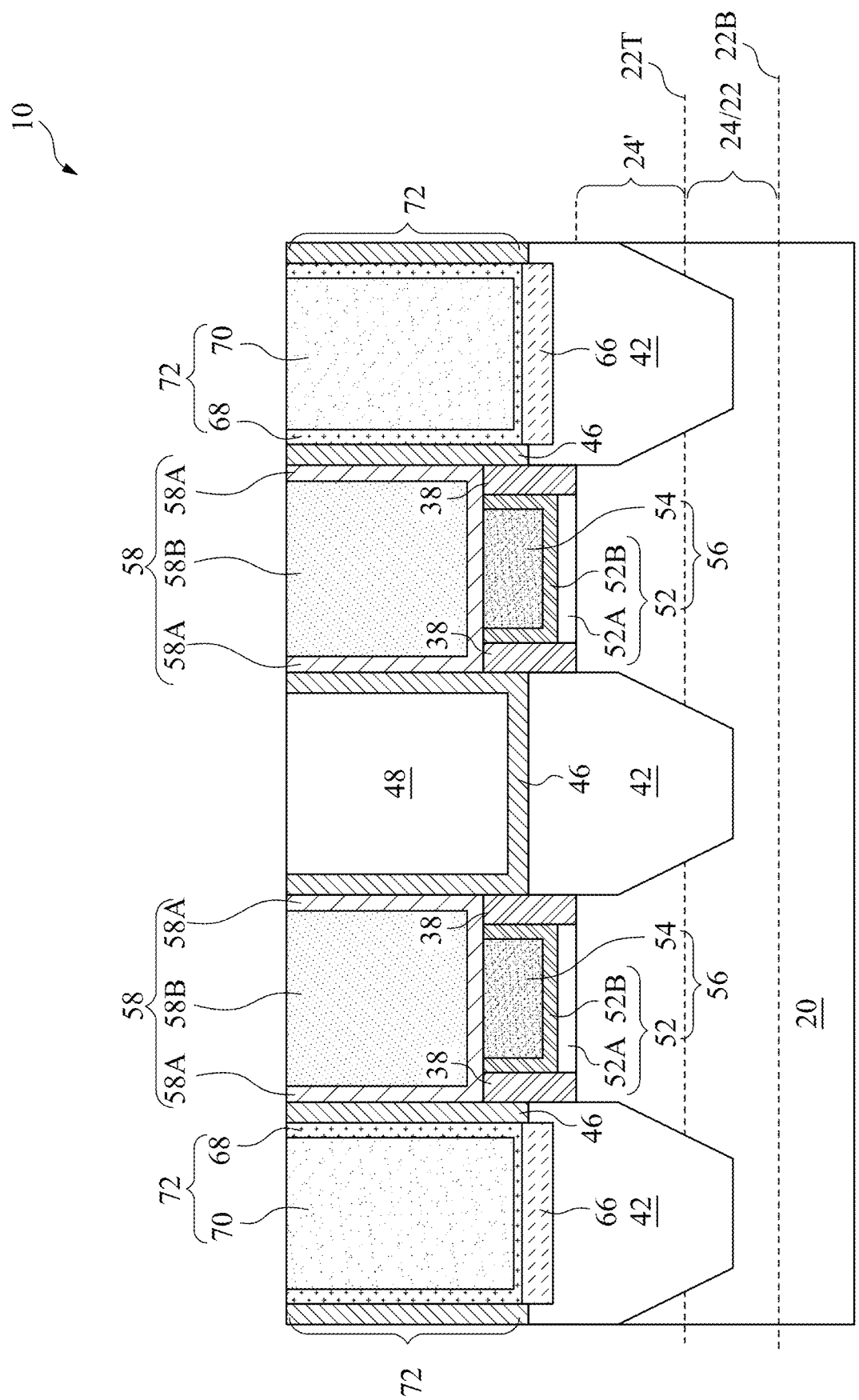

FIGS. 15 and 16 illustrate the formation of source/drain silicide regions 66 and source/drain contact plugs 72 in accordance with some embodiments. The respective process is illustrated as process 226 in the process flow 200 as shown in FIG. 24. Source/drain silicide regions 66 and source/drain contact plugs 72 are also formed to electrically connect to source/drain regions 42. The formation processes may include depositing a metal layer extending into source/drain contact openings 64, and depositing a capping layer on the metal layer. The metal layer may include titanium, cobalt, or the like. The capping layer may be formed of or comprise a metal nitride such as titanium nitride. An annealing process is then performed to react the metal layer with top surface portions of source/drain regions 42, so that source/drain silicide regions 66 are formed. The capping layer and the unreacted portions of the metal layer may be removed, or may be left unremoved. The remaining portions of source/drain contact openings 64 are then filled, for example, by metal nitride layers 68 and filling metal regions 70. The metal nitride layers 68 may be formed of or comprises titanium nitride. The filling metal regions 70 may comprise cobalt, tungsten, aluminum, or the like.

A planarization process such as a CMP process or a mechanical polishing process is then performed to remove excess materials over ILD 48 and masking regions 58, leaving source/drain contact plugs 72. Mask layer 60A is also removed. The resulting structure is shown in FIG. 16.

Figure 17:
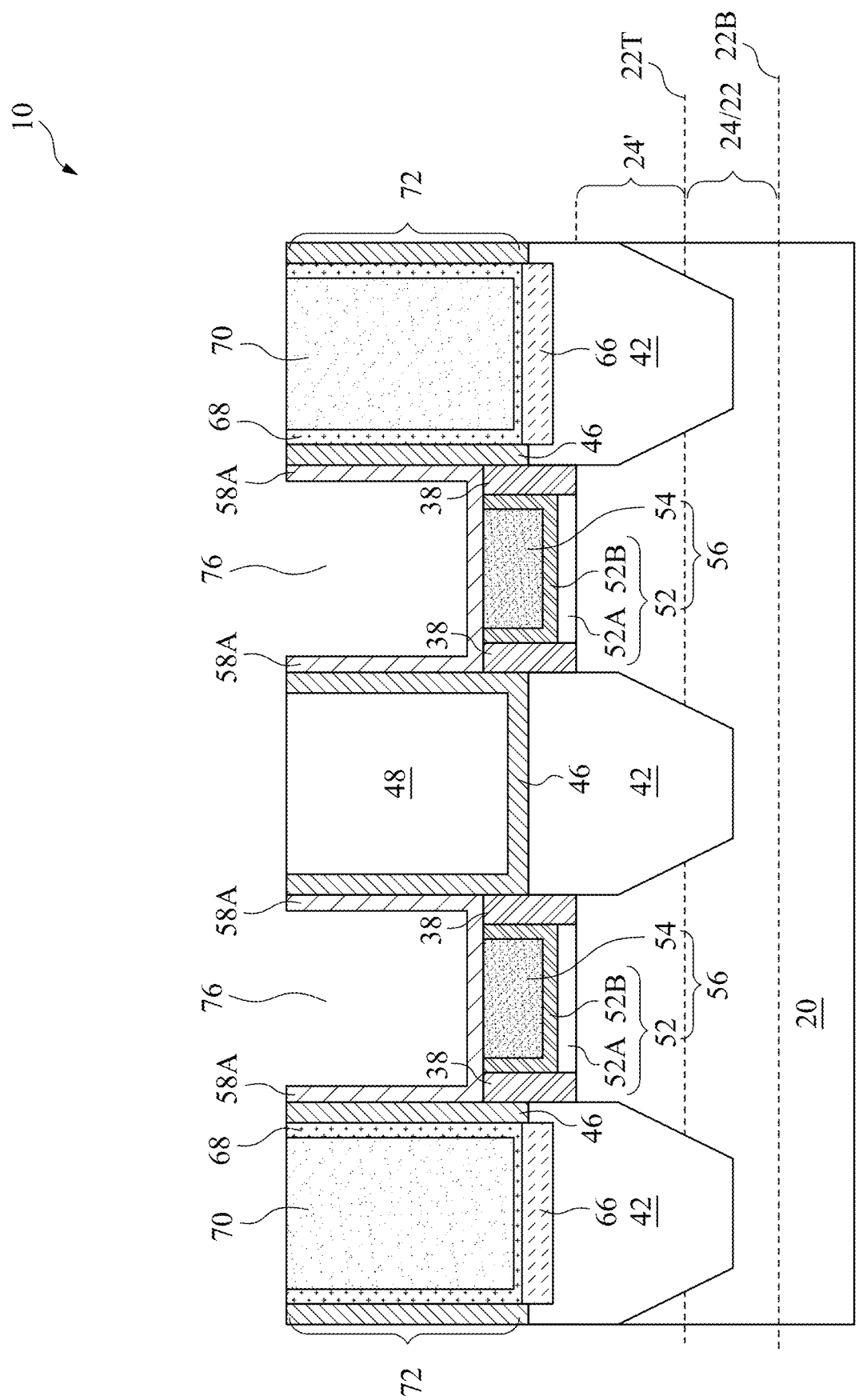

In a subsequent process, masking regions 58B are etched. The respective process is illustrated as process 228 in the process flow 200 as shown in FIG. 24. Openings 76 are thus formed, as shown in FIG. 17. The etching is performed with a selected etching chemical, so that liner 58A and source/drain contact plugs 72 are not etched. The etching may be performed through a dry etching process, a wet etching process, or a dry etching process followed by a wet etching process. The etching may also be anisotropic or isotropic, or may include an anisotropic etching process followed by an isotropic process. In accordance with some embodiments, all of masking regions 58B throughout wafer 10 are removed.

In accordance with some embodiments in which masking regions 58B is formed of or comprises silicon, a dry etching process may be performed using the fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, or the mixture of HBr, $Cl_2$, $O_2$, and $CH_2F_2$ etc. In the etching process, a high power higher than about 1 kilowatt and a low pressure of lower than about 2 torr may be used, with plasma being generated. The wafer temperature may be in the range between about 100° C. and about 300° C. In accordance with alternative embodiments, masking regions 58B are removed through a wet etching process. The wet etching process may be performed using KOH, tetramethylammonium hydroxide (TMAH), $CH_3COOH$, $NH_4OH$, $H_2O_2$, Isopropanol (IPA), the solution of HF, $HNO_3$, and $H_2O$, or the like.

In the etching process, liner 58A acts as an etch stop layer. The etching selectivity ER58B'/ER58A' is high, wherein ER58B' is the etching rate of masking layer 58B, and ER58A' is the etching rate of liner 58A. For example, etching selectivity ER58B'/ER58A' may be higher than about 2, and may be in the range between about 2 and about 20. Accordingly, liner 58A remains after the etching, and is exposed.

Figure 18:
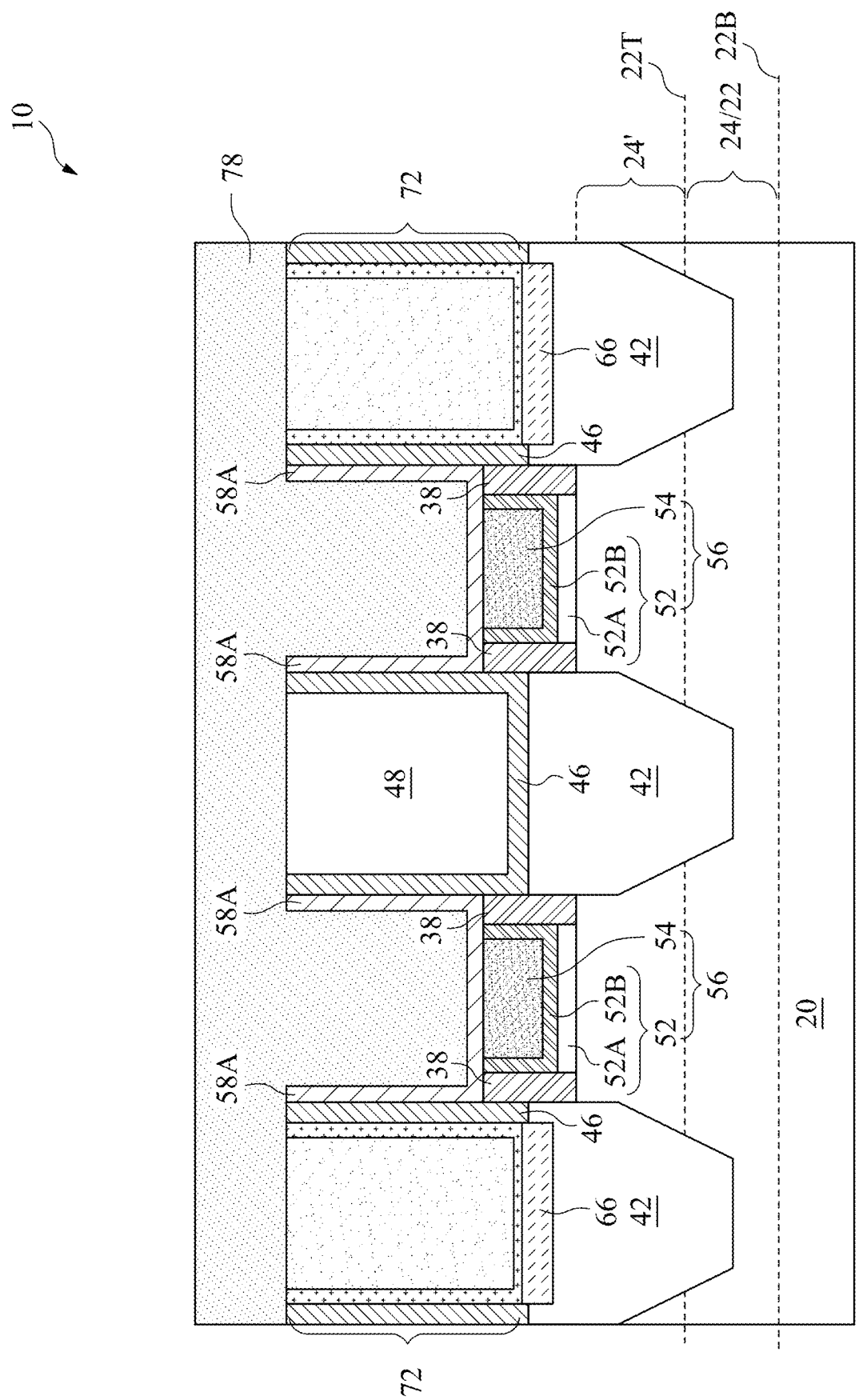

Referring to FIG. 18, ILD 78 is deposited to fills openings 76 (FIG. 17). The respective process is illustrated as process 230 in the process flow 200 as shown in FIG. 24. In accordance with some embodiments, ILD 78 is formed of a dielectric material selected from the same group of candidate materials for forming ILD 48. For example, ILD 78 may be formed of or comprise silicon oxide, BSG, PSG, PBSG, or the like. Also, the materials of ILD 78 and ILD 48 may be the same as each other or different from each other. ILD 78 is deposited to a level higher than the top surface of ILD 48. Also, regardless of whether ILD 78 and ILD 48 are formed of the same material or different materials, there may be (or may not be) distinguishable interface in between. A planarization process may be performed to level the top surface of ILD 78.

In accordance with alternative embodiments in which masking regions 58B are formed of a dielectric material (rather than formed of a semiconductor such as silicon), the processes shown in FIGS. 17 and 18 may be skipped, and mask regions 58B are left in the final structure, while ILD 78 is not formed. For example, in the embodiments shown in FIGS. 22B, 22C, and 23, mask regions 58B will be in the positions where ILD 78 is located.

Figure 19A:
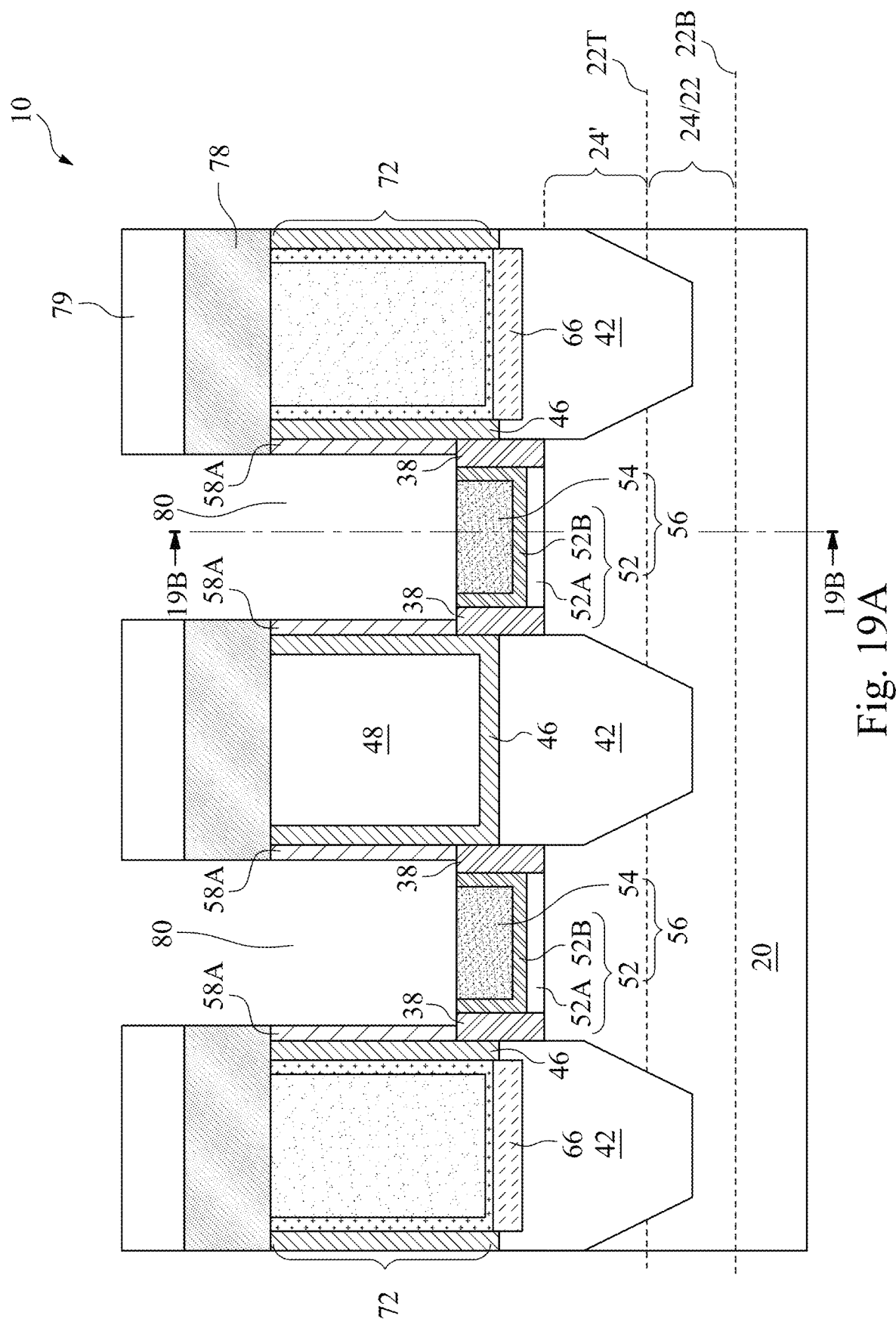
Figure 23:
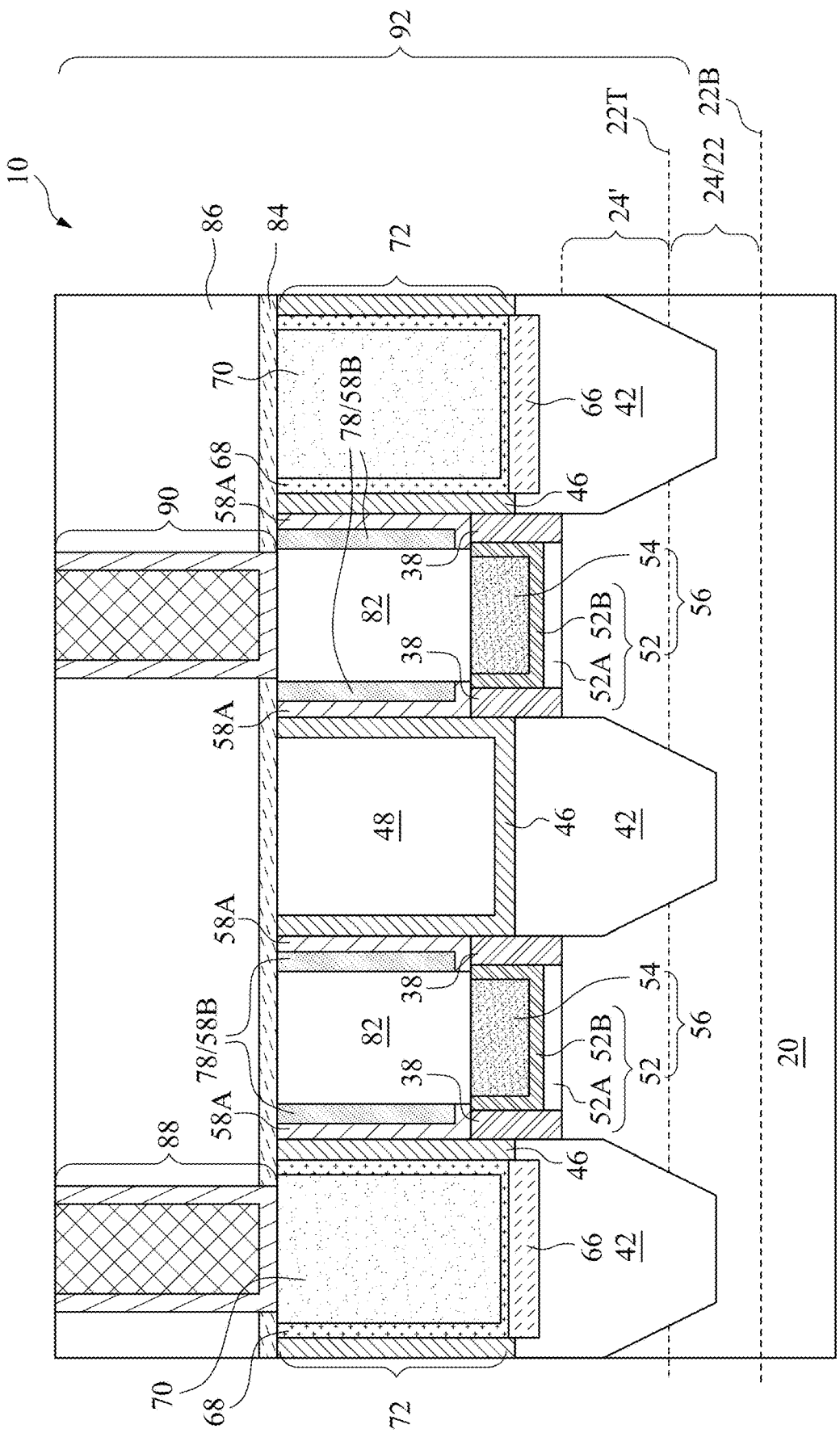
FIG. 23 illustrate the cross-sectional view of a FinFET in accordance with some embodiments.

Next, as shown in FIG. 19A, ILD 78 is patterned using etching mask 79 which may include a patterned photoresist. The respective process is illustrated as process 232 in the process flow 200 as shown in FIG. 24. The resulting openings 80 are aligned to gate stacks 56. After the etching, the bottom portions of liners 58A are exposed, and are etched to reveal the underlying gate electrodes 54. The respective process is illustrated as process 234 in the process flow 200 as shown in FIG. 24. In accordance with some embodiments, after the etching, the sidewall portions of the vertical portions of liner 58A are exposed. In accordance with alternative embodiments, after the etching, there are some portions of ILD 78 (or masking regions 58B if they are dielectric regions) between opposite portions of CESL 46. For example, FIG. 23 illustrates an embodiment, in which some portions of ILD 78 or masking regions 58B are left.

Figure 19B:
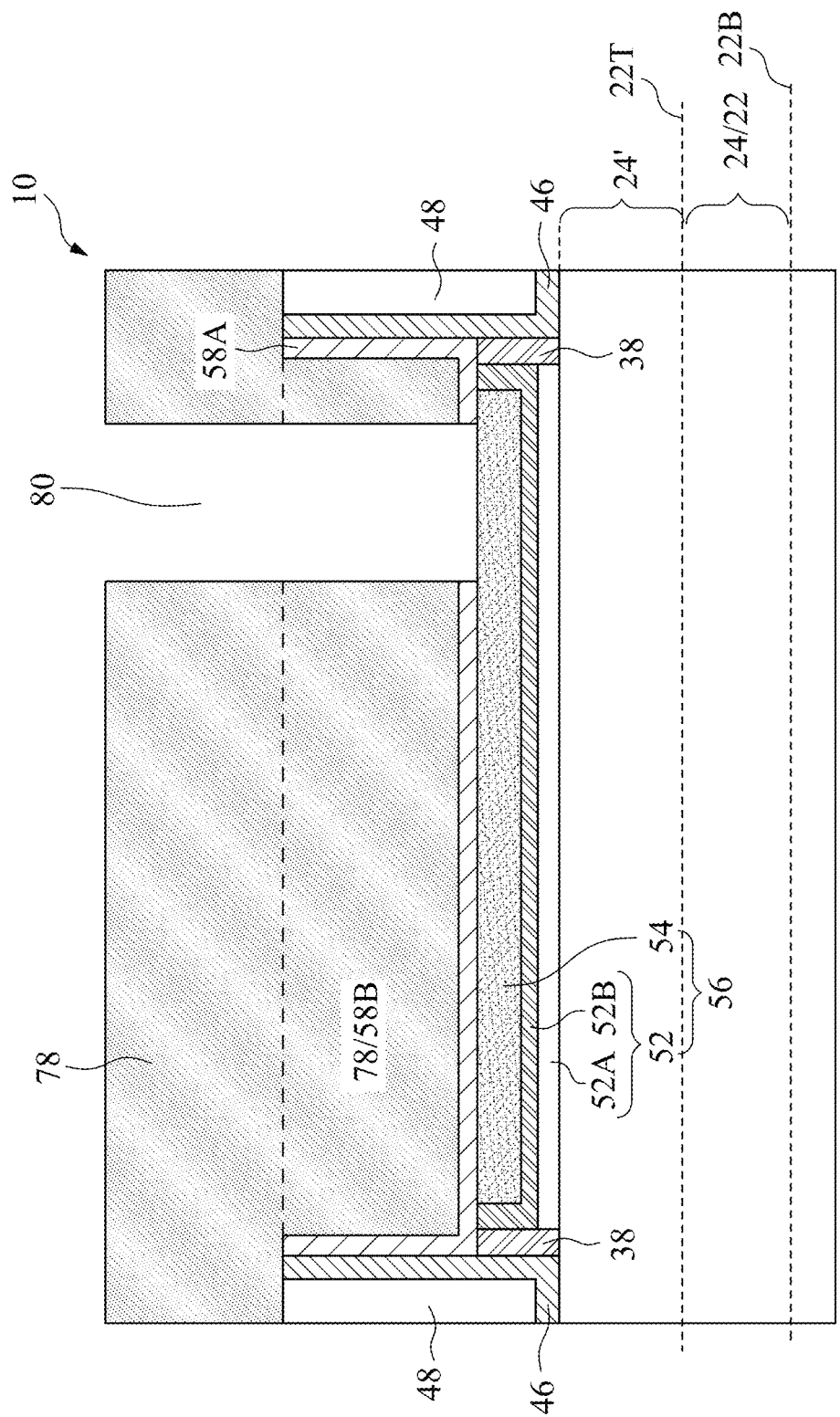

FIG. 19B illustrates the cross-section 19B-19B as shown in FIG. 19A. ILD 78 or masking regions 58B may be viewed in the cross-section. In accordance with some embodiments in which ILD 78 is formed, the top surface of ILD 78 is higher than the top surface of ILD 48. In accordance with alternative embodiments in which masking regions 58B are dielectric regions and are not replaced with ILD 78, masking regions 58B are viewed in the cross-section, and the top surfaces of masking regions 58B would be planar with the top surfaces of ILD 48.

Figure 20:
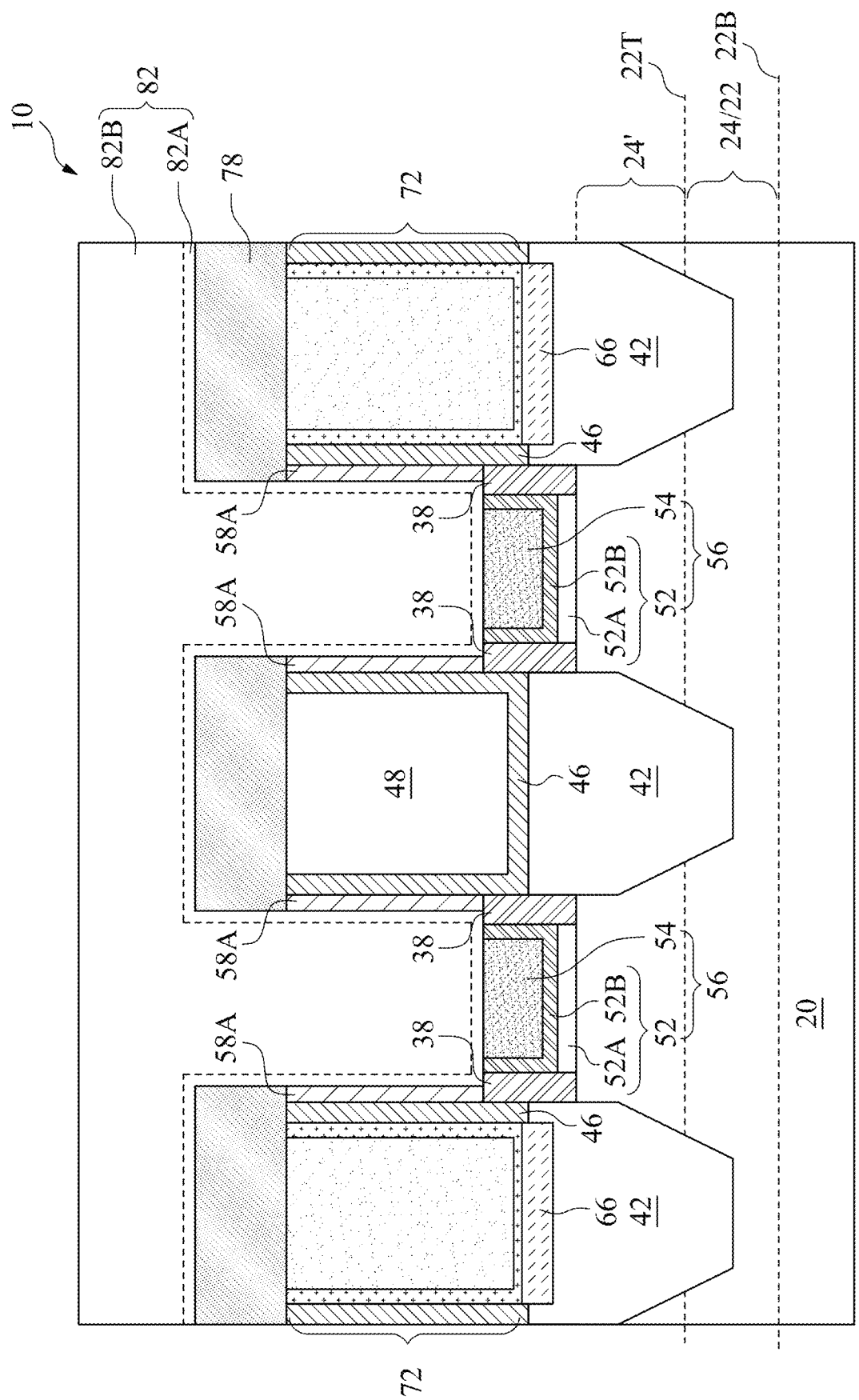
Figure 21:
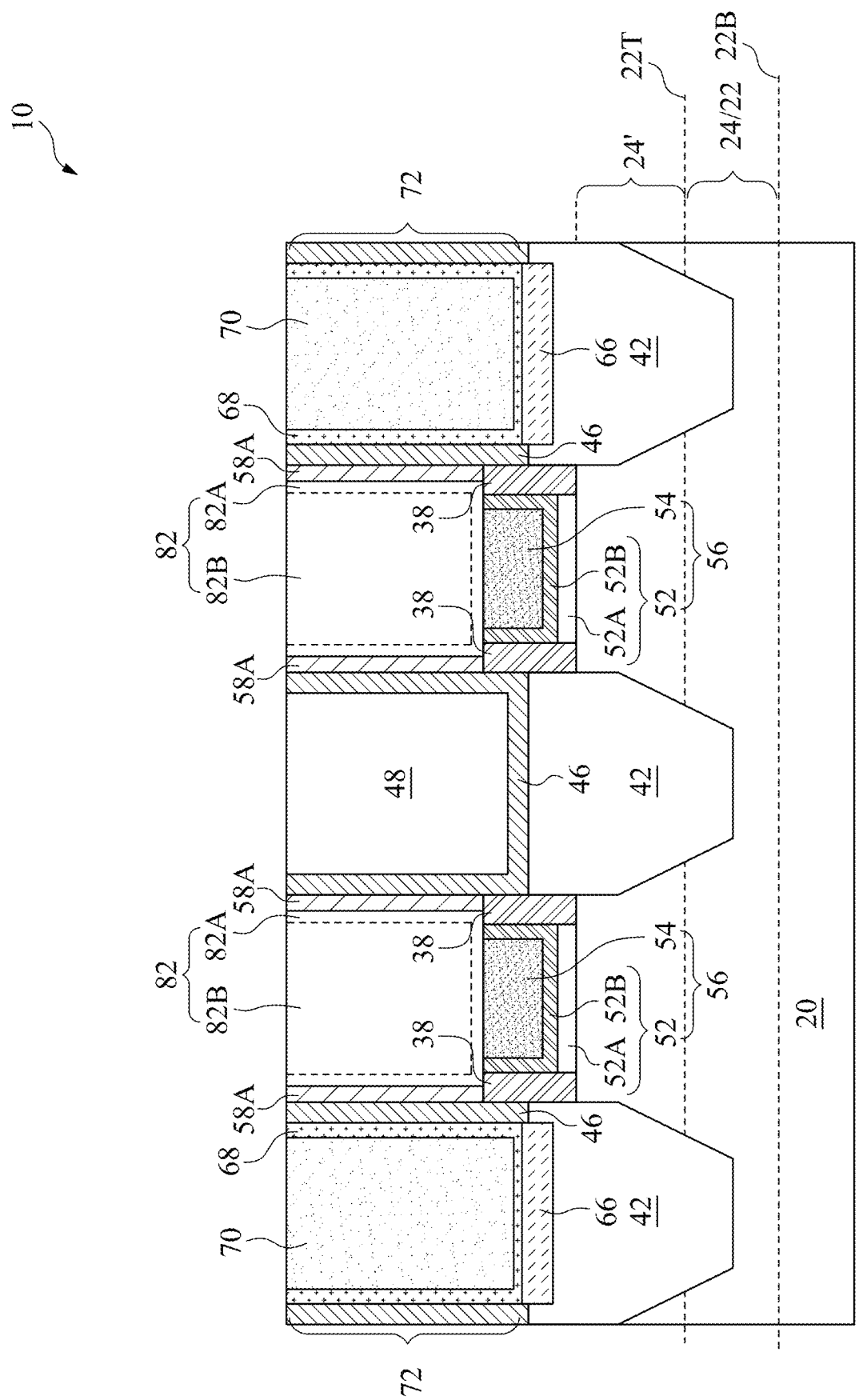

FIGS. 20 and 21 illustrate the formation of gate contact plugs 82 in accordance with some embodiments. The respective process is illustrated as process 236 in the process flow 200 as shown in FIG. 24. Referring to FIG. 20, barrier layer 82A is deposited. In accordance with some embodiments, barrier layer 82A is formed of or comprises titanium, titanium nitride, tantalum, tantalum nitride, or the like. Barrier layer 82A may be formed as a conformal layer, which may be deposited using CVD, ALD, PVD, or the like. After the formation of barrier layer 82A, a metal seed layer (not shown) is formed. The metal seed layer may be formed of or comprise copper, and may be formed, for example, using PVD.

FIG. 20 further illustrates the deposition of conductive material 82B. In accordance with some embodiments, conductive material 82B comprises copper or a copper alloy, cobalt, tungsten, aluminum, or the like, or combinations thereof. The deposition process may include Electro Chemical Plating (ECP), electroless plating, CVD, or the like. Conductive material 82B fully fills openings 80.

In accordance with alternative embodiments, instead of depositing both of the barrier layer 82A and conductive material 82B, a single homogeneous material (such as tungsten, cobalt, or the like) is deposited to fill openings 80, so that the resulting gate contact plug 82 is barrier-less. Accordingly, dashed lines are shown to indicate that there may be, or may not be, barrier layer 82A formed.

Next, a planarization process such as a Chemical Mechanical Polish (CMP) process or a mechanical grinding process is performed to remove excess portions of the conductive material 82B and barrier layer 82A. The planarization process may be stopped on the top surface of ILD 48 (or masking regions 58B if ILD 78 is not formed), or on the top surface of ILD 78, which is higher than the top surface of ILD 48. The resulting structure is shown in FIG. 21. The remaining portions of conductive material 82B and barrier layer 82A form gate contact plugs 82. In accordance with some embodiments, gate contact plugs 82 overlap the outer portions of the corresponding underlying gate spacers 38. In accordance with alternative embodiments, the vertical portions of liner 58A are wider than gate spacers 38, and overlap both of the respective underlying gate spacers 38 and gate stacks 56.

Figure 22A:
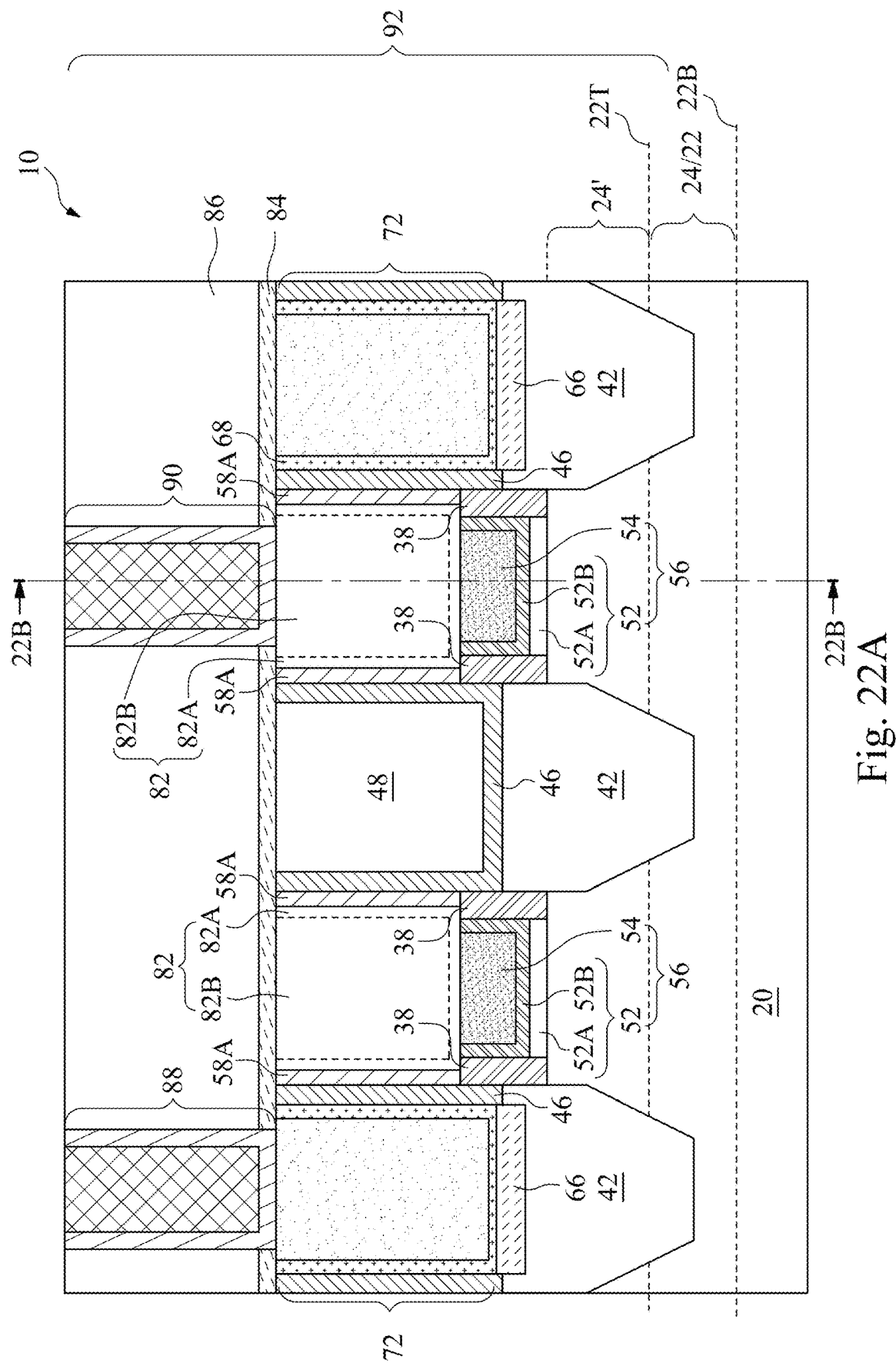

Referring to FIG. 22A, etch stop layer 84 is deposited, followed by the deposition of ILD 86. Etch stop layer 84 may include a metal oxide, a metal nitride, or the like. In accordance with some embodiments, etch stop layer 84 includes an aluminum nitride (AlN) layer, a silicon oxy-carbide layer over the aluminum nitride layer, and an aluminum oxide layer over the silicon oxy-carbide layer. ILD 86 may be formed of a material selected from same group of candidate materials for forming ILD 48.

FIG. 22A further illustrates the formation of source/drain contact plug 88 and gate contact plug 90 in accordance with some embodiments. Source/drain contact plug 88 is over and contacting source/drain contact plug 72. Gate contact plug 90 is over and contacting gate contact plug 82. FinFET 92 is thus formed.

Figure 22B:
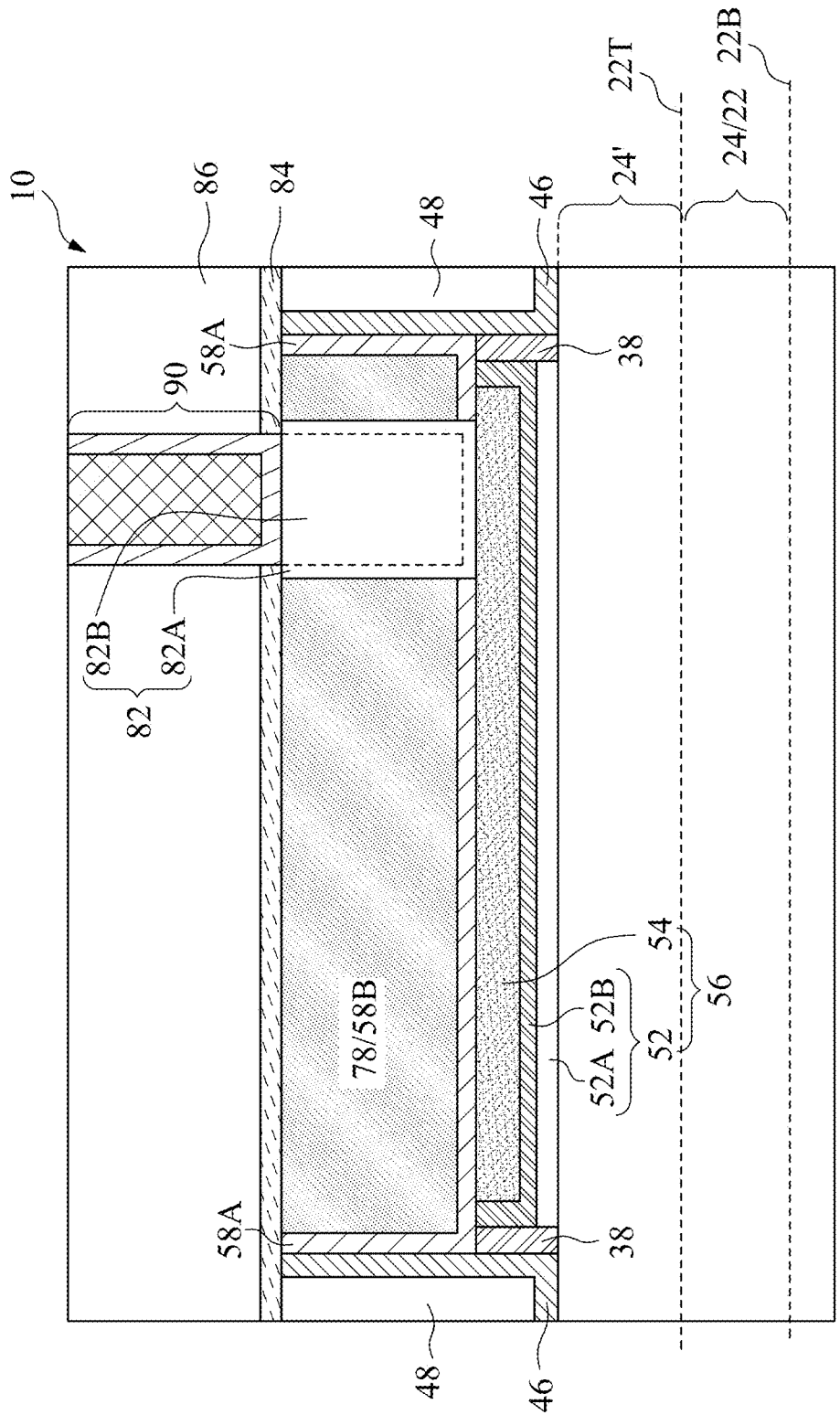
Figure 22C:
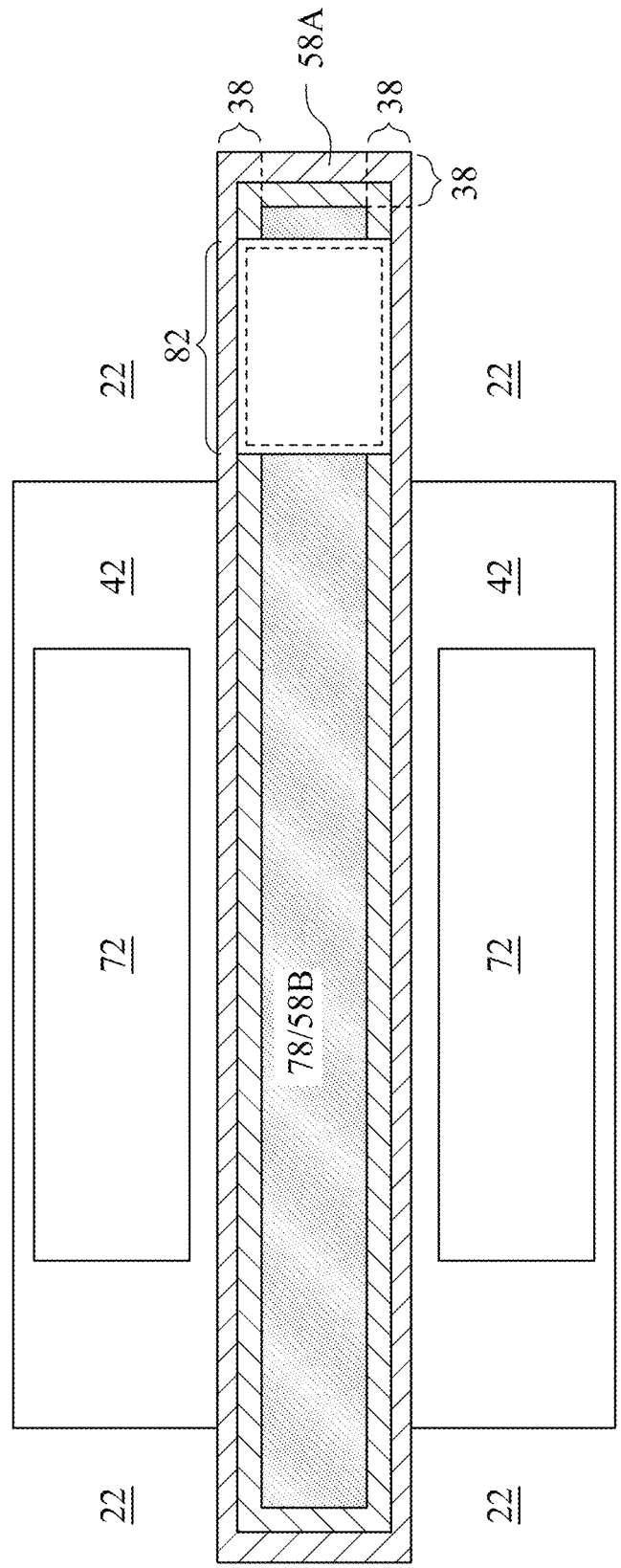

FIG. 22B illustrates the cross-section 22B-22B in FIG. 22A. Etch stop layer 84 is over, and contacts, both of ILD 48 and ILD 78 (or both of ILD 48 and masking regions 58B). FIG. 22C illustrates a top view of the structure shown in FIGS. 22A and 22C. it is shown that liner 58A may form a ring, which overlaps the ring of gate spacer 38. The liner 58A further encircles ILD 78 (or masking layer 58B) and gate contact plug 82.

FIG. 23 illustrates a cross-sectional view of FinFET 92 in accordance with alternative embodiments. These embodiments are similar to the embodiments as shown in FIG. 22A, except that in the formation of gate contact openings 80 (FIG. 19A), some portions of ILD 78 (or masking region 58B) are left un-etched, as shown in FIG. 23. Accordingly, in the cross-sectional view as shown in FIG. 23, the remaining portions of ILD 78 (or masking region 58B) separate gate contact plug 82 from the vertical portions of liner 58A.

The embodiments of the present disclosure have some advantageous features. The SAC masks are formed as having bi-layer structures, which include liners and masking regions over the liners. The masking regions are formed of a material (such as silicon) that has a high etching selectivity relative to the ILD, and hence in the formation of source/drain contact openings, the masking regions can provide good protection to the underlying features such as gate electrodes, and may reduce leakage. Furthermore, the masking regions have a high etching selectivity relative to the liners, and the liners may protect the underlying gate stack when the masking regions are etched.

In accordance with some embodiments of the present disclosure, a method includes forming a dummy gate stack over a semiconductor region; forming gate spacers on opposing sides of the dummy gate stack; forming a source/drain region on a side of the dummy gate stack; forming a first inter-layer dielectric over the source/drain region; replacing the dummy gate stack with a replacement gate stack; recessing the replacement gate stack to form a recess between the gate spacers; depositing a liner extending into the recess; depositing a masking layer over the liner and extending into the recess; forming an etching mask covering a portion of the masking layer; etching the first inter-layer dielectric to form a source/drain contact opening, wherein the source/drain region is underlying and exposed to the source/drain contact opening; forming a source/drain contact plug in the source/drain contact opening; and forming a gate contact plug extending between the gate spacers and electrically connecting to the replacement gate stack. In an embodiment, the depositing the masking layer comprises depositing a silicon layer. In an embodiment, the method further comprises removing the masking layer to reveal a bottom portion of the liner. In an embodiment, the method further comprises performing an anisotropic etching process to remove the bottom portion of the liner, wherein the gate contact plug is formed after the bottom portion of the liner is removed. In an embodiment, the silicon layer is a semiconductor layer. In an embodiment, the method further comprises replacing the mask layer with a second inter-layer dielectric; and etching a portion of the second inter-layer dielectric between the gate spacers to form a gate contact opening between the gate spacers. In an embodiment, the etching mask covers a first portion of the masking layer, and a second portion of the masking layer is exposed when the first inter-layer dielectric is etched to form the source/drain contact opening. In an embodiment, in the etching of the first inter-layer dielectric to form the source/drain contact opening, the masking layer has a lower etching rate than the liner and the first inter-layer dielectric. In an embodiment, the gate contact plug physically contacts a remaining portion of the liner. In an embodiment, the depositing the liner comprises a conformal deposition process.

In accordance with some embodiments of the present disclosure, an integrated circuit structure includes a semiconductor region; a gate stack over the semiconductor region; a gate contact plug over and electrically connecting to the gate stack; a liner comprising opposing portions on opposite sides of the gate contact plug; gate spacers on opposing sides of a combined region comprising the gate stack, the gate contact plug, and the liner; a source/drain region on a side of the gate stack; and a first inter-layer dielectric, wherein the gate spacers and the combined region are in the first inter-layer dielectric. In an embodiment, the liner comprises a dielectric material. In an embodiment, the gate contact plug contacts vertical portions of the liner to form vertical interfaces. In an embodiment, the integrated circuit structure further comprises an etch stop layer over and contacting the first inter-layer dielectric and the gate contact plug, wherein the vertical interfaces extend to contact a bottom surface of the etch stop layer. In an embodiment, the liner overlaps the gate spacers. In an embodiment, the gate contact plug overlaps some portions of the gate spacers.

In accordance with some embodiments of the present disclosure, an integrated circuit structure includes a semiconductor fin; a gate stack on a first top surface and sidewalls of the semiconductor fin; a gate contact plug over and electrically connected to the gate stack; a dielectric liner encircling the gate contact plug, wherein bottom surfaces of both of the gate contact plug and the dielectric liner are in contact with a second top surface of the gate stack; an etch stop layer over and contacting the dielectric liner; and a gate spacer comprising a first portion overlapped by a second portion of the dielectric liner, wherein the gate spacer encircles the gate stack. In an embodiment, the integrated circuit structure further comprises a source/drain region extending into the semiconductor fin; and a contact etch stop layer comprising a vertical portion contacting both of the gate spacer and the dielectric liner. In an embodiment, a bottom of the contact etch stop layer contacts the source/drain region. In an embodiment, the integrated circuit structure further comprises a dielectric region between the gate contact plug and the dielectric liner; and an inter-layer dielectric comprising opposing portions on opposite sides of a combined region comprising the gate contact plug, the dielectric region, and the dielectric liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a dummy gate stack over a semiconductor region;
forming gate spacers on opposing sides of the dummy gate stack;
forming a source/drain region on a side of the dummy gate stack;
forming a first inter-layer dielectric over the source/drain region;
replacing the dummy gate stack with a replacement gate stack;
recessing the replacement gate stack to form a recess between the gate spacers;
depositing a liner extending into the recess;
depositing a masking layer over the liner and extending into the recess;
forming an etching mask covering a portion of the masking layer;
etching the first inter-layer dielectric to form a source/drain contact opening, wherein the source/drain region is underlying and exposed to the source/drain contact opening;
forming a source/drain contact plug in the source/drain contact opening; and
forming a gate contact plug extending between the gate spacers and electrically connecting to the replacement gate stack.

2. The method of claim 1, wherein the depositing the masking layer comprises depositing a silicon layer.

3. The method of claim 2 further comprising removing the masking layer to reveal a bottom portion of the liner.

4. The method of claim 2, wherein the silicon layer is a semiconductor layer.

5. The method of claim 3 further comprising:
performing an anisotropic etching process to remove the bottom portion of the liner, wherein the gate contact plug is formed after the bottom portion of the liner is removed.

6. The method of claim 5, wherein the gate contact plug physically contacts a remaining portion of the liner.

7. The method of claim 1 further comprising:
replacing the mask layer with a second inter-layer dielectric; and
etching a portion of the second inter-layer dielectric between the gate spacers to form a gate contact opening between the gate spacers.

8. The method of claim 1, wherein the etching mask covers a first portion of the masking layer, and a second portion of the masking layer is exposed when the first inter-layer dielectric is etched to form the source/drain contact opening.

9. The method of claim 8, wherein in the etching of the first inter-layer dielectric to form the source/drain contact opening, the masking layer has a lower etching rate than the liner and the first inter-layer dielectric.

10. The method of claim 1, wherein the depositing the liner comprises a conformal deposition process.

11. A method comprising:
forming a gate stack over a semiconductor region;
forming gate spacers on opposing sides of the gate stack;
forming a liner over the gate stack, wherein the forming the liner comprises depositing a dielectric material through a conformal deposition process, wherein the liner comprises a bottom portion with an entirety of the bottom portion having a first uniform thickness, and a sidewall portion having a second uniform thickness equal to the first uniform thickness;
forming a gate contact plug over and electrically connecting to the gate stack, wherein the gate contact plug is between vertical portions of the liner, and wherein the gate contact plug physically contacts the vertical portions of the liner to form vertical interfaces;
forming a source/drain region aside of the gate stack; and
forming an inter-layer dielectric, wherein the gate spacers, the liner, and the gate contact plug are in the inter-layer dielectric.

12. The method of claim 11 further comprising etching a first horizontal portion of the liner, and wherein after the first horizontal portion of the liner is etched, a second horizontal portion of the liner is left.

13. The method of claim 12 further comprising depositing a dielectric layer over and contacting the second horizontal portion of the liner to form a horizontal interface.

14. The method of claim 11, wherein a first part of the liner is directly over and overlaps a second part of the gate spacers.

15. The method of claim 14, wherein the first part of the liner physically contacts the second part of the gate spacers.

16. The method of claim 11 further comprising forming a contact etch stop layer over the source/drain region, wherein the inter-layer dielectric is formed over the contact etch stop layer, and wherein the liner is spaced apart from the inter-layer dielectric by the contact etch stop layer.

17. A method comprising:
forming a gate stack on a first top surface and sidewalls of a semiconductor fin;
depositing a dielectric liner, wherein a bottom surface of the dielectric liner is in contact with a second top surface of the gate stack;
forming a mask region in a basin that is formed of the dielectric liner;
removing the mask region to reveal a horizontal portion of the dielectric liner, wherein the horizontal portion is directly under the mask region;
removing the horizontal portion of the dielectric liner, wherein vertical portions of the dielectric liner are left; and
forming a gate contact plug in a space encircled by the vertical portions of the dielectric liner.

18. The method of claim 17 further comprising:
forming a source/drain region extending into the semiconductor fin; and
forming a contact etch stop layer, wherein the vertical portions of the dielectric liner physically contact the contact etch stop layer to form vertical interfaces.

19. The method of claim 18, wherein a bottom of the contact etch stop layer contacts the source/drain region.

20. The method of claim 17, wherein the mask region comprises a semiconductor material.

* * * * *